US012787482B2

(12) United States Patent
Chen et al.

(10) Patent No.: US 12,787,482 B2
(45) Date of Patent: Nov. 3, 2026

(54) SOLAR CELL

(71) Applicant: Trina Solar Co., Ltd., Changzhou (CN)

(72) Inventors: Daming Chen, Changzhou (CN); Wei Liu, Changzhou (CN); Yifeng Chen, Changzhou (CN); Dongyun Lv, Changzhou (CN)

(73) Assignee: Trina Solar Co., Ltd., Changzhou (CN)

( * ) Notice: Subject to any disclaimer, the term of this patent is extended or adjusted under 35 U.S.C. 154(b) by 0 days.

(21) Appl. No.: 19/009,203

(22) Filed: Jan. 3, 2025

(65) Prior Publication Data

US 2025/0151453 A1 May 8, 2025

(30) Foreign Application Priority Data

Mar. 29, 2024 (CN) ......................... 202410373895.7

(51) Int. Cl.

| | |
|---|---|
| ***H10F 77/20*** | (2025.01) |
| ***H10F 71/00*** | (2025.01) |
| ***H10F 77/30*** | (2025.01) |
| ***H10F 77/70*** | (2025.01) |

(52) U.S. Cl.

CPC ......... *H10F 77/251* (2025.01); *H10F 71/129* (2025.01); *H10F 71/138* (2025.01); *H10F 77/215* (2025.01); *H10F 77/311* (2025.01); *H10F 77/315* (2025.01); *H10F 77/703* (2025.01)

(58) Field of Classification Search

CPC ..... H10F 77/215; H10F 77/311; H10F 77/315
See application file for complete search history.

(56) References Cited

U.S. PATENT DOCUMENTS

| | | | | |
|---|---|---|---|---|
| 2016/0359071 | A1 | 12/2016 | Chae et al. | |
| 2020/0058806 | A1* | 2/2020 | Sperlich | H10F 77/247 |
| 2022/0115545 | A1* | 4/2022 | Huang | H10F 10/146 |
| 2022/0158009 | A1* | 5/2022 | Jin | H10F 77/148 |
| 2024/0355941 | A1* | 10/2024 | Hu | H10F 77/20 |

FOREIGN PATENT DOCUMENTS

| | | | |
|---|---|---|---|
| CN | 107195699 | * | 9/2017 |
| CN | 112201701 | A | 1/2021 |
| CN | 113506832 | A | 10/2021 |

(Continued)

OTHER PUBLICATIONS

European Patent Office, Extended Search Report issued in corresponding Application No. 25151846.0, dated Jun. 17, 2025, 10 pp.

(Continued)

*Primary Examiner* — Jayne L Mershon

(74) *Attorney, Agent, or Firm* — Taft, Stettinius & Hollister LLP

(57) ABSTRACT

A solar cell, a preparation method thereof, a photovoltaic module, and a photovoltaic system, wherein the solar cell includes a substrate and a first tunnel oxide layer and a passivation medium layer sequentially stacked on a first surface of the substrate. The first tunnel oxide layer is at least partially in contact with the first surface. The passivation medium layer includes at least a transparent conductive oxide layer.

17 Claims, 11 Drawing Sheets

(56) References Cited

FOREIGN PATENT DOCUMENTS

| | | | |
|---|---|---|---|
| CN | 214336723 | U | 10/2021 |
| CN | 114005888 | A | 2/2022 |
| CN | 215731736 | U | 2/2022 |
| CN | 217306521 | U | 8/2022 |
| CN | 115274927 | A | 11/2022 |
| CN | 116759484 | A | 9/2023 |
| CN | 219677267 | U | 9/2023 |
| CN | 116913985 | A | 10/2023 |
| CN | 116914012 | A | 10/2023 |
| CN | 117059679 | A | 11/2023 |
| CN | 117199193 | A | 12/2023 |
| CN | 117438480 | A | 1/2024 |
| CN | 117457777 | A | 1/2024 |
| CN | 117558831 | A | 2/2024 |
| EP | 4425572 | A2 | 9/2024 |
| JP | 2022081366 | A | 5/2022 |
| JP | 7395041 | B1 | 12/2023 |
| JP | 2024038961 | A | 3/2024 |

OTHER PUBLICATIONS

Chinese Patent Office, Decision to Grant issued in corresponding Application No. 202410373895.7, dated May 30, 2024, 3 pp.
Chinese Patent Office, Office Action issued in corresponding Application No. 202410373895.7, dated May 9, 2024, 11 pp.
Australian Patent Office, Examination Report No. 1 issued in corresponding Application No. 2024227401, dated Nov. 13, 2024, 5 pp.
Van De Loo, B. W. H. et al., "Silicon surface passivation by transparent conductive zinc oxide", Journal of Applied Physics, Mar. 14, 2019, vol. 125, No. 10, Article No. 105305, pp. 105305-1-105305-9, DOI: 10.1063/1.5054166.
Van De Loo, B. W. H. et al., "Silicon surface passivation by transparent conductive zinc oxide", Journal of Applied 1 Physics, Mar. 14, 2019, vol. 125, No. 10, Article No. 105305, pp. 105305-1-105305-9, DOI: 10.1063/1.5054166.
Macco, Bart et al., "Atomic-layer-deposited Al-doped zinc oxide as a passivating conductive contacting layer for n+-doped surfaces in silicon solar cells," Solar Energy Materials and Solar Cells, Sep. 15, 2021, vol. 233, Article No. 111386, pp. 1-13, DOI: 10.1016.
Japan Patent Office, extended search report issued in corresponding Application No. 2025-004165, dated Feb. 17, 2026.

* cited by examiner

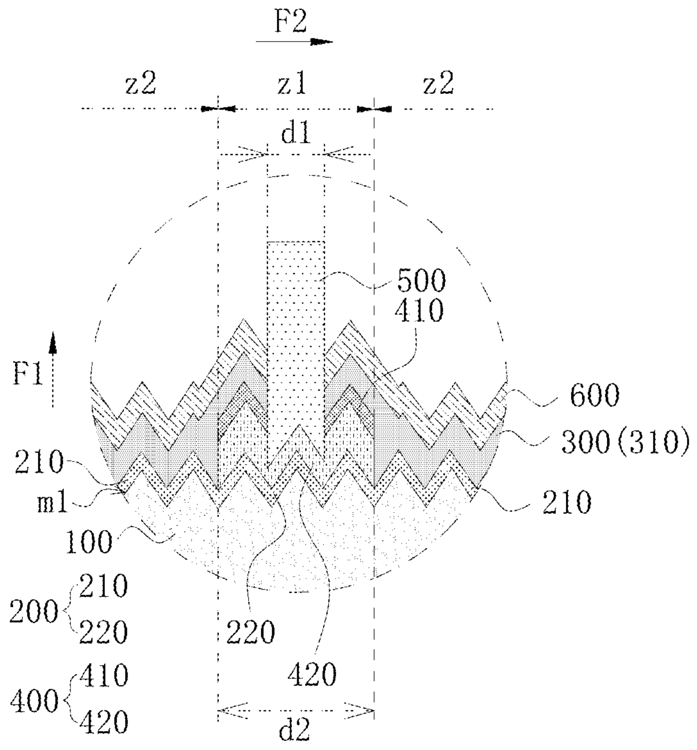

FIG. 11

SF: providing a substrate including a first surface and a second surface opposite to the first surface

↓

SG: sequentially forming a first tunnel oxide layer and a passivation medium layer on the first surface of the substrate, where the first tunnel oxide layer is at least partially in contact with the first surface, the passivation medium layer is formed on a surface of the first tunnel oxide layer away from the substrate, and the passivation medium layer at least includes a transparent conductive oxide layer.

FIG. 12

SOLAR CELL

CROSS-REFERENCE TO RELATED APPLICATION

This application claims priority to Chinese patent application No. 202410373895.7, filed on Mar. 29, 2024, and titled "SOLAR CELL, PREPARATION METHOD THEREOF, PHOTOVOLTAIC MODULE AND PHOTOVOLTAIC SYSTEM", the contents of which is hereby incorporated herein in its entirety by reference.

TECHNICAL FIELD

The present application relates to the field of photovoltaic technology, and specifically to solar cells, preparation methods thereof, photovoltaic modules, and photovoltaic systems.

BACKGROUND

In a tunnel oxide passivated contact (TOPCon) solar cell, a tunnel oxide layer and a doped polysilicon layer are typically formed on the surface of a silicon wafer, together constituting a passivated contact structure to provide excellent interface passivation for the silicon wafer. However, the doped polysilicon layer often has significant parasitic light absorption, which reduces photovoltaic conversion efficiency of the solar cell.

SUMMARY

In view of the above, there is a need to provide a solar cell, a preparation method thereof, a photovoltaic module, and a photovoltaic system.

According to an aspect of the present application, an embodiment of a solar cell includes:

- a substrate including a first surface and a second surface opposite to the first surface;
- a first tunnel oxide layer disposed on the first surface of the substrate and at least partially in contact with the first surface; and
- a passivation medium layer disposed on a surface of the first tunnel oxide layer away from the substrate, the passivation medium layer including at least a transparent conductive oxide layer.

In an embodiment, a material of the transparent conductive oxide layer includes a doped metal oxide.

In an embodiment, the doped metal oxide includes zinc oxide doped with at least one of aluminum, boron, or gallium.

In an embodiment, the doped metal oxide is selected from the group consisting of aluminum-doped zinc oxide, gallium-doped zinc oxide, boron-doped zinc oxide, and any combination thereof.

In an embodiment, a material of the transparent conductive oxide layer includes aluminum-doped zinc oxide, and a mass percentage of aluminum in the aluminum-doped zinc oxide is in a range from 1% to 20%.

In an embodiment, a thickness of the transparent conductive oxide layer is in a range from 5 nm to 20 nm.

In an embodiment, the passivation medium layer includes a transparent conductive oxide layer and a first passivation layer; the first passivation layer is disposed on a surface of the transparent conductive oxide layer away from the first tunnel oxide layer.

In an embodiment, the passivation medium layer includes at least one transparent conductive oxide layer and at least one first passivation layer.

In an embodiment, the passivation medium layer includes one transparent conductive oxide layer and one first passivation layer, the transparent conductive oxide layer and the first passivation layer are sequentially stacked along a direction away from the first tunnel oxide layer.

In an embodiment, the passivation medium layer includes at least two transparent conductive oxide layers and at least two first passivation layers, the transparent conductive oxide layers and the first passivation layers are alternately stacked along a direction away from the first tunnel oxide layer.

In an embodiment, a material of the first passivation layer is selected from the group consisting of aluminum oxide, silicon nitride, and a combination thereof.

In an embodiment, a thickness of the first passivation layer is in a range from 1 nm to 20 nm.

In an embodiment, the first surface includes an electrode region and a non-electrode region; orthographic projections of the first tunnel oxide layer and the passivation medium layer on the first surface include an overlapping region; the overlapping region is located at least in the non-electrode region of the first surface.

In an embodiment, the solar cell further includes a first passivating contact layer, and the first passivating contact layer is disposed on the first surface and located in the electrode region.

In an embodiment, the first tunnel oxide layer is in contact with the first surface in the non-electrode region; the first passivating contact layer is disposed on the first surface and located in the electrode region.

In an embodiment, the first tunnel oxide layer includes a first portion and a second portion; the first portion is in contact with the first surface in the non-electrode region; the second portion is spaced from the first surface in the electrode region, the second portion is disposed on a surface of the first passivating contact layer away from the first surface.

In an embodiment, the first passivating contact layer includes a second tunnel oxide layer and a first doped semiconductor layer stacked sequentially on the first surface in the electrode region.

In an embodiment, a thickness of the second tunnel oxide layer is in a range from 0.8 nm to 2 nm.

In an embodiment, a thickness of the first doped semiconductor layer is in a range from 10 nm to 500 nm.

In an embodiment, the first tunnel oxide layer comprises a first portion and a second portion; the first portion is in contact with the first surface in the non-electrode region, and the second portion is in contact with the first surface in the electrode region; the first passivating contact layer is disposed on a surface of the second portion away from the substrate.

In an embodiment, the first passivating contact layer includes a first doped semiconductor layer; the first doped semiconductor layer is disposed on a surface of the second portion away from the substrate.

In an embodiment, the first passivating contact layer further includes a second tunnel oxide layer; the second tunnel oxide layer is disposed on a surface of the first doped semiconductor layer away from the second portion.

In an embodiment, the solar cell further includes a first electrode; an orthographic projection of the first electrode on the first surface is located in the electrode region of the first surface, and the first electrode is in Ohmic contact with the first passivating contact layer.

In an embodiment, along a width direction of the first electrode, a size ratio of the first electrode to the first passivating contact layer is greater than 0 and less than or equal to 1.

In an embodiment, the solar cell further includes a second passivation layer; the second passivation layer is disposed on a surface of the passivation medium layer away from the first tunnel oxide layer.

In an embodiment, the solar cell further includes a second passivating contact layer; the second passivating contact layer is disposed on the second surface of the substrate.

In an embodiment, the second passivating contact layer includes a third tunnel oxide layer and a second doped semiconductor layer sequentially stacked on the second surface.

In an embodiment, a thickness of the third tunnel oxide layer is in a range from 0.8 nm to 2 nm.

In an embodiment, a thickness of the second doped semiconductor layer is in a range from 10 nm to 1000 nm.

In an embodiment, the solar cell further includes a second electrode; the second electrode is disposed on the second surface of the substrate, and the second electrode is in Ohmic contact with the second passivating contact layer.

In an embodiment, the solar cell further includes a third passivation layer; the third passivation layer is disposed on a surface of the second passivating contact layer away from the substrate.

In an embodiment, a thickness of the first tunnel oxide layer is in a range from 0.8 nm to 2 nm.

According to another aspect of the present application, an embodiment of a method for preparing a solar cell includes:

- providing a substrate including a first surface and a second surface opposite to the first surface; and
- sequentially forming a first tunnel oxide layer and a passivation medium layer on the first surface of the substrate, where the first tunnel oxide layer is at least partially in contact with the first surface, the passivation medium layer is disposed on a surface of the first tunnel oxide layer away from the substrate, and the passivation medium layer includes at least a transparent conductive oxide layer.

In an embodiment, a material of the transparent conductive oxide layer includes a doped metal oxide.

In an embodiment, the doped metal oxide is selected from the group consisting of aluminum-doped zinc oxide, gallium-doped zinc oxide, boron-doped zinc oxide, and any combination thereof.

In an embodiment, a material of the transparent conductive oxide layer includes aluminum-doped zinc oxide, and a mass percentage of aluminum in the aluminum-doped zinc oxide is in a range from 1% to 20%.

In an embodiment, forming the passivation medium layer includes forming a transparent conductive oxide layer and a first passivation layer; the first passivation layer is formed on a surface of the transparent conductive oxide layer away from the first tunnel oxide layer.

In an embodiment, forming the passivation medium layer includes forming at least one transparent conductive oxide layer and at least one first passivation layer.

In an embodiment, forming the passivation medium layer includes forming one transparent conductive oxide layer and forming one first passivation layer, the transparent conductive oxide layer and the first passivation layer are sequentially formed and stacked along a direction away from the first tunnel oxide layer.

In an embodiment, forming the passivation medium layer includes forming at least two transparent conductive oxide layers and forming at least two first passivation layers, the transparent conductive oxide layers and the first passivation layers are alternately formed and stacked along a direction away from the first tunnel oxide layer.

In an embodiment, a material of the first passivation layer is selected from the group consisting of aluminum oxide, silicon nitride, and a combination thereof.

In an embodiment, the first surface includes an electrode region and a non-electrode region; before sequentially forming the first tunnel oxide layer and the passivation medium layer on the first surface of the substrate, the method further includes:

- forming a first passivating contact layer on the first surface in the electrode region;
- wherein the first tunnel oxide layer is in contact with the first surface in the non-electrode region.

In an embodiment, the first tunnel oxide layer includes a first portion and a second portion; the first portion is in contact with the first surface in the non-electrode region; the second portion is spaced from the first surface in the electrode region, and the second portion is formed on a surface of the first passivating contact layer away from the first surface.

In an embodiment, forming the first passivating contact layer includes forming a second tunnel oxide layer and a first doped semiconductor layer, which are stacked sequentially on the first surface in the electrode region.

In an embodiment, after sequentially forming the first tunnel oxide layer and the passivation medium layer on the first surface of the substrate, the method further includes:

- forming a first electrode on the first surface of the substrate, wherein an orthographic projection of the first electrode on the first surface is located in the electrode region of the first surface, and the first electrode is in Ohmic contact with the first passivating contact layer.

In an embodiment, after sequentially forming the first tunnel oxide layer and the passivation medium layer on the first surface of the substrate, the method further includes:

- forming a second passivation layer on a surface of the passivation medium layer away from the first tunnel oxide layer.

In an embodiment, the method further includes forming a second passivating contact layer on the second surface of the substrate.

In an embodiment, after forming the second passivating contact layer on the second surface of the substrate, the method further includes forming a second electrode on the second surface of the substrate, wherein the second electrode is in Ohmic contact with the second passivating contact layer.

In an embodiment, after forming the second passivating contact layer on the second surface of the substrate, the method further includes forming a third passivation layer on a surface of the second passivating contact layer away from the substrate.

According to yet another aspect of the present application, an embodiment of a photovoltaic module includes the solar cell in any one of the above embodiments.

According to yet another aspect of the present application, an embodiment of a photovoltaic system includes the solar module in any one of the above embodiments.

In the above-described embodiments of the solar cell, the preparation method thereof, the photovoltaic module, and the photovoltaic system, the first tunnel oxide layer and the passivation medium layer are sequentially stacked on the first surface of the substrate to form a staked structure, the first tunnel oxide layer is at least partially in contact with the first surface, and the passivation medium layer includes at least the transparent conductive oxide layer. Under the cooperation between the first tunnel oxide layer and the transparent conductive oxide layer, good surface passivation effect can be provided, parasitic absorption can be reduced, and charge carrier transport can be facilitated, thereby reducing the charge carrier recombination current density and improving the conversion efficiency of the solar cell.

Additional aspects and advantages of embodiments of the present application will be partially provided in the following description, and partially become apparent from the following description or be understood by practicing embodiments of the present application.

BRIEF DESCRIPTION OF THE DRAWINGS

In order to more clearly describe the embodiments of the present application, the accompanying drawings to be used in the description of the embodiments will be described briefly. Obviously, the drawings described below are only some embodiments of the present application. For ordinary skilled persons in the art, other drawings can also be obtained based on the following drawings without creative work.

FIG. 11 is a partial enlarged view of a solar cell in yet another embodiment of the present application.

FIG. 12 shows a flow chart of a method for preparing a solar cell in an embodiment of the present application.

REFERENCE SIGNS IN THE DRAWINGS

Figure 1:
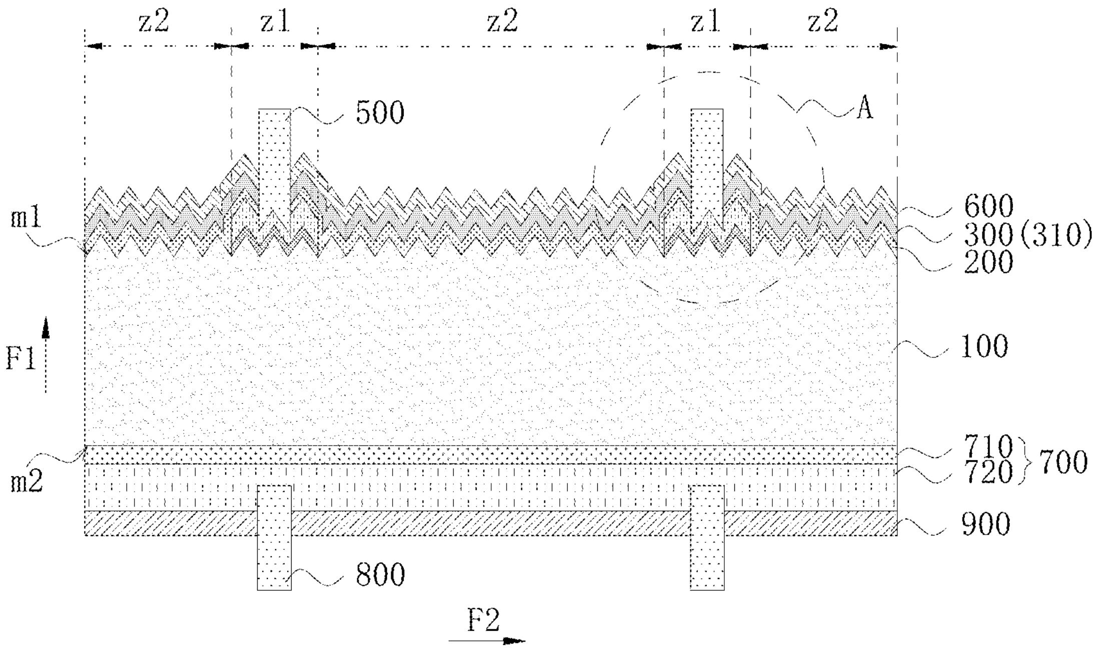
FIG. 1 is a schematic structural view of a solar cell in an embodiment of the present application.

100—substrate, m1—first surface, z1—electrode region, d2—second dimension, z2—non-electrode region, m2—second surface; 200—first tunnel oxide layer, 210—first portion, 220—second portion; 300—passivation medium layer, 310—transparent conductive oxide layer, 310*a*—first transparent conductive oxide layer, 310*b*—second transparent conductive oxide layer, 320—first passivation layer, 400—first passivating contact layer, 410—second tunnel oxide layer, 420—first doped semiconductor layer, 500—first electrode, d1—first dimension, 600—second passivation layer, 700—second passivating contact layer, 710—third tunnel oxide layer, 720—second doped semiconductor layer, 800—second electrode, 900—third passivation layer, F1—first direction, F2—second direction, SF, SG, SH, SI, SJ, SK, SL, SM-steps.

DETAILED DESCRIPTION

To make the objectives, features, and advantages of the present application more apparent and better understandable, detailed explanations of specific embodiments are provided below with reference to accompanying drawings. Many specific details are disclosed in the following description to facilitate a comprehensive understanding of the present application. However, it should be noted that the present application can be implemented in various ways different from those described herein, and those skilled in the art may make similar improvements without departing from the contents of the present application. Therefore, the present application is not limited to the specific embodiments disclosed below.

In the description of the present application, it should be understood that the terms "central", "longitudinal", "transverse", "length", "width", "thickness", "upper", "lower", "front", "rear", "left", "right", "vertical", "horizontal", "top", "bottom", "inner", "outer", "clockwise", "counter-clockwise", "axial", "radial", "circumferential", etc. indicate the orientations or positional relationships on the basis of the drawings. These terms are only used for describing the present application and simplifying the description, rather than indicating or implying that the related devices or elements must have the specific orientations, or be constructed or operated in the specific orientations, and therefore cannot be understood as limitations of the present application.

In addition, the terms "first" and "second" are used merely as labels to distinguish one element having a certain name from another element having the same name, and cannot be understood as indicating or implying any priority, precedence, or order of one element over another, or indicating the quantity of the element. Therefore, the element modified by "first" or "second" may explicitly or implicitly includes at least one of the elements. In the description of the present application, "a plurality of" means at least two, such as two, three, etc., unless otherwise specifically defined.

In the present application, unless otherwise clearly specified and defined, the terms "installed", "connected", "coupled", "fixed" and the like should be interpreted broadly. For example, an element, when being referred to as being "installed", "connected", "coupled", "fixed" to another element, unless otherwise specifically defined, may be fixedly connected, detachably connected, or integrated to the other element, may be mechanically connected or electrically connected to the other element, and may be directly connected to the other element or connected to the other element via an intermediate element. For those of ordinary skill in the art, the specific meaning of the above-mentioned terms in the present application can be understood according to specific circumstances. It is worth noting that, in the description and claims, when one element is described as “electrically connected” to another element, the electrical connection not only can be achieved by a direct contact between the two elements thereby forming a pathway for electric power transmission or current conduction, but also can be achieved through an intermediate element between the two elements. The two elements and the intermediate element together form a pathway for electric power transmission or current conduction. For those skilled in the art, the specific meaning of the term “electrical connection” and variations thereof in the present application can be understood based on the context.

In the present application, unless otherwise specifically defined, an element, e.g., a layer, when being referred to as being disposed “on” or “under” another element, e.g., a surface, may be in direct contact with the other element or contact the other element via an intermediate element. Moreover, the element, when being referred to as being disposed “on”, “above”, “over” another element, may be located right above or obliquely above the other element, or merely located at a horizontal level higher than the other element; the element, when being referred to as being disposed “under”, “below”, “beneath” another element, may be located right below or obliquely below the other element, or merely located at a horizontal level lower than the other element.

It should be noted that an element, when being referred to as being “fixed” or “mounted” to another element, may be directly fixed or mounted to the other element or via an intermediate element. Such terms as “vertical”, “horizontal”, “up”, “down”, “left”, “right” and the like used herein are for illustrative purposes only and are not meant to be the only ways for implementing the present application.

Figure 2:
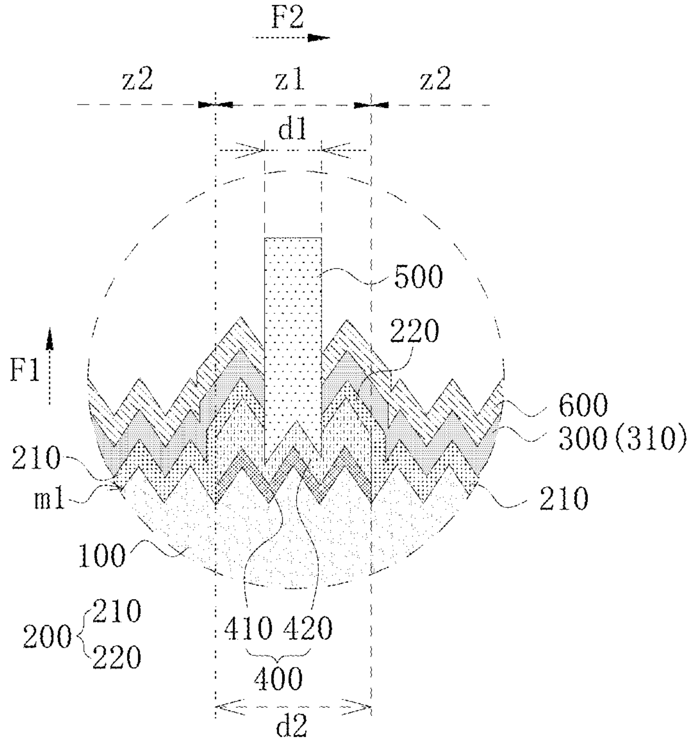
FIG. 2 is a partial enlarged view of area A in FIG. 1.

FIG. 1 is a schematic structural view of a solar cell in an embodiment of the present application. FIG. 2 is a partial enlarged view of area A in FIG. 1. For clarity, only the features relevant to the embodiments of the present application are shown.

Referring to FIG. 1 and FIG. 2, an embodiment of the present application provides a solar cell, including a substrate 100, a first tunnel oxide layer 200, and a passivation medium layer 300.

The substrate 100 is configured to receive incident light and generate photogenerated carriers. For example, the solar cell can be a tunnel oxide passivated contact (TOPCon) solar cell. The material of the substrate 100 can be selected according to actual needs. For example, the substrate 100 can be a silicon wafer. The doping type of the substrate 100 is not limited. For example, the substrate 100 can be an n-type doped silicon wafer or a p-type doped silicon wafer, which is not specifically limited in the embodiments of the present application. In a specific embodiment, the substrate 100 can be an n-type monocrystalline silicon wafer.

The substrate 100 includes a first surface m1 and a second surface m2 opposite to the first surface m1. In other words, the first surface m1 and the second surface m2 are two opposite surfaces. The first surface m1 and the second surface m2 are opposite to each other along a first direction F1. The first direction F1 is the thickness direction of the substrate 100. Both the first surface m1 and the second surface m2 can be used to receive incident light. In a specific embodiment, the first surface m1 is the light-receiving surface, and the second surface m2 is the back surface. It can be understood that the light-receiving surface and the back surface are relative terms, and in a solar cell or a photovoltaic module, the light-receiving surface specifically refers to the surface of the substrate 100 which most of sunlight irradiates. With the development of the solar cell technology, the back surface also can receive the sunlight, mainly from the reflected light or scattered light in the surrounding environment, and make use of light energy. Referring to FIG. 1 and FIG. 2, the first surface m1 commonly includes a textured structure for increasing the light absorption area, thereby enhancing the photocurrent and improving the conversion efficiency of the solar cell.

The first tunnel oxide layer 200 is adapted to provide an interface passivation for the first surface m1 of the substrate 100, achieving chemical passivation. Specifically, by saturating the dangling bonds on the surface of the substrate 100 and reducing the interface defect state density of the first surface m1 of the substrate 100, the recombination centers at the first surface m1 of the substrate 100 can be reduced, and thus the recombination rate of carriers can be reduced. The material of the first tunnel oxide layer 200 can be a dielectric material, such as at least one of silicon oxide, magnesium fluoride, amorphous silicon, polysilicon, silicon carbide, silicon nitride, silicon oxynitride, aluminum oxide, or titanium oxide. In a specific embodiment, the first tunnel oxide layer 200 is made of silicon oxide. Other tunnel oxide layers mentioned below can have similar functions and/or be made of similar materials as the first tunnel oxide layer 200, which will not be repeatedly described herein.

The first tunnel oxide layer 200 is disposed on the first surface m1 of the substrate 100. The first tunnel oxide layer 200 is at least partially in contact with the first surface m1 of the substrate 100. That is, a portion or the entirety of the first tunnel oxide layer 200 is in contact with the first surface m1 of the substrate 100, or a portion or the entirety of the first surface m1 of the substrate 100 is in contact with the first tunnel oxide layer 200. In some embodiments, the entirety of the first tunnel oxide layer 200 can be in contact with the first surface m1, while the first tunnel oxide layer 200 can cover the entirety of the first surface m1 or cover only a portion of the first surface m1. In some other embodiments, e.g., as shown in FIGS. 1 and 2, the first tunnel oxide layer 200 can include a portion in contact with the first surface m1 and another portion not in contact with the first surface m1.

The passivation medium layer 300 is disposed on a surface of the first tunnel oxide layer 200 away from the substrate 100. The passivation medium layer 300 mainly functions to provide surface passivation in the solar cell, effectively chemically passivating the dangling bonds on the surface of the substrate 100. The passivation medium layer 300 can have a single-layer or multi-layer structure. The passivation medium layer 300 includes at least a transparent conductive oxide layer 310. The transparent conductive oxide layer 310 is a layer structure made of transparent conductive oxide material, with high light transmittance and low electrical resistivity. That is, when the passivation medium layer 300 is a single-layer structure, the passivation medium layer 300 is the transparent conductive oxide layer 310. When the passivation medium layer 300 is a multi-layer structure, the passivation medium layer 300 includes multiple transparent conductive oxide layers 310, or includes at least one transparent conductive oxide layer 310 and at least one other layer. Specifically, when the passivation medium layer 300 is a multi-layer structure, the transparent conductive oxide layer 310 is disposed on the surface of the first tunnel oxide layer 200 away from the substrate 100, and the other layers in the multi-layer structure are stacked on the surface of the transparent conductive oxide layer 310 away from the first tunnel oxide layer 200. The other layers in the multi-layer structure can include another transparent conductive oxide layer 310, a passivation layer, etc. In the embodiment as shown in FIG. 1 and FIG. 2, the passivation medium layer 300 is a single-layer structure, i.e., is the transparent conductive oxide layer 310.

If a tunnel oxide layer and a doped polysilicon layer, together forming a passivating contact structure, are both formed on the first surface m1, the notable light absorption ability of the doped polysilicon layer will lead to significant parasitic light absorption and current loss. If the doped polysilicon layer is further heavily doped to increase the degree of band bending at the surface of the substrate 100, the light absorption ability of the heavily doped polysilicon layer will be further enhanced, and the parasitic light absorption of the doped polysilicon layer will be more severe, making it even more difficult to solve the problem of current loss. In the present application, the passivating contact structure is formed by the passivation medium layer 300 and the first tunnel oxide layer 200, and the passivation medium layer 300 includes at least the transparent conductive oxide layer 310. Since the transparent conductive oxide layer 310 has high light transmittance, the light absorption ability of the transparent conductive oxide layer 310 is much lower than that of a doped polysilicon layer. Moreover, a more significant band bending can be formed at the first surface m1 of the substrate 100. Thus, not only the parasitic light absorption caused by unwanted light absorption can be reduced, but also field passivation for minority carriers and selective transmission for majority carriers can be achieved. Consequently, a better surface passivation effect can be achieved, and the carrier recombination current density can be reduced.

The first tunnel oxide layer 200 and the passivation medium layer 300 together form a stacked structure, in which the passivation medium layer 300 includes at least the transparent conductive oxide layer 310. Under the cooperation between the first tunnel oxide layer 200 and the transparent conductive oxide layer 310, good surface passivation effect can be provided, the parasitic absorption can be reduced, and charge carrier transport can be facilitated, thereby reducing the carrier recombination current density and improving the conversion efficiency of the solar cell.

In some embodiments, referring to FIGS. 1 and 2, the material of the transparent conductive oxide layer 310 includes a doped metal oxide. In some embodiments, the doped metal oxide is zinc oxide doped with at least one of aluminum, boron, or gallium. For example, the doped metal oxide is any one or a combination of aluminum-doped zinc oxide, gallium-doped zinc oxide, or boron-doped zinc oxide. The material of the transparent conductive oxide layer 310 can be selected according to actual needs.

In some embodiments, referring to FIGS. 1 and 2, the material of the transparent conductive oxide layer 310 includes aluminum-doped zinc oxide. Since aluminum-doped zinc oxide can cause a more significant band bending at the first surface m1 of the substrate 100, the carrier recombination current density can be further reduced.

In some embodiments, a mass percentage of aluminum in the aluminum-doped zinc oxide is in a range from 1% to 20%. For example, the mass percentage of aluminum in the aluminum-doped zinc oxide can be 1%, 2%, 3%, 5%, 6%, 8%, 9.5%, 10%, 11%, 13%, 15%, 17%, 19%, or 20%. The transparent conductive oxide layer 310 with the range of mass percentage of aluminum can have an adequate electrical conductivity.

In some embodiments, referring to FIGS. 1 and 2, a thickness of the transparent conductive oxide layer 310 is in a range from 5 nm to 20 nm. For example, the thickness of the transparent conductive oxide layer can be 5 nm, 6 nm, 7 nm, 8 nm, 9 nm, 10 nm, 12 nm, 14 nm, 15 nm, 17 nm, 18 nm, 19 nm, or 20 nm. The transparent conductive oxide layer 310 within the range of thickness can have excellent electrical and optical performances.

In addition, the range of thickness can reduce both the sheet resistance and the production cost of the transparent conductive oxide layer 310.

Figure 3:
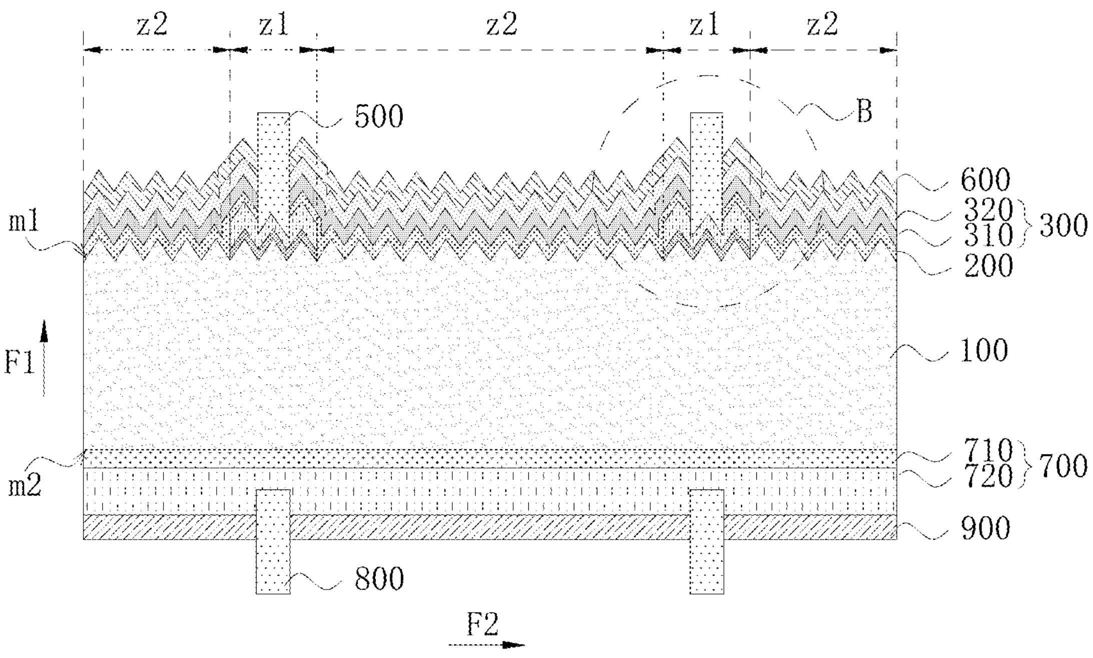
FIG. 3 is a schematic structural view of a solar cell in another embodiment of the present application.
Figure 4:
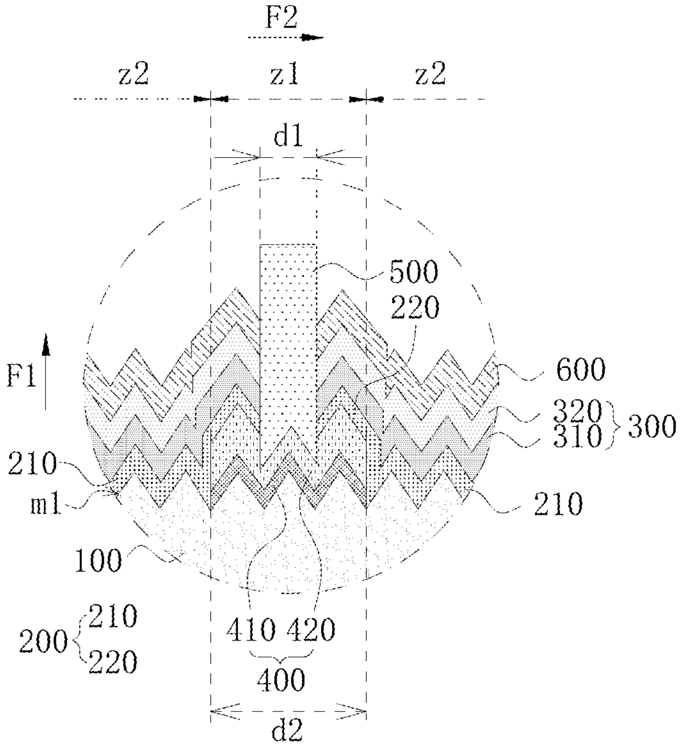
FIG. 4 is a partial enlarged view of area B in FIG. 3.
Figure 5:
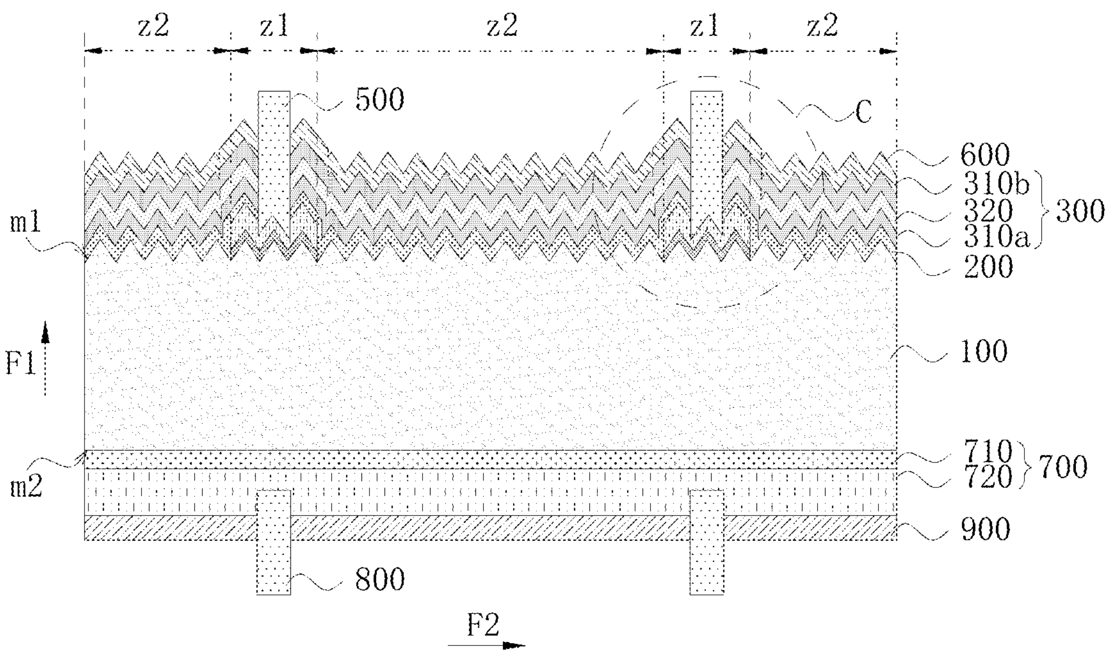
FIG. 5 is a schematic structural view of a solar cell in yet another embodiment of the present application.
Figure 6:
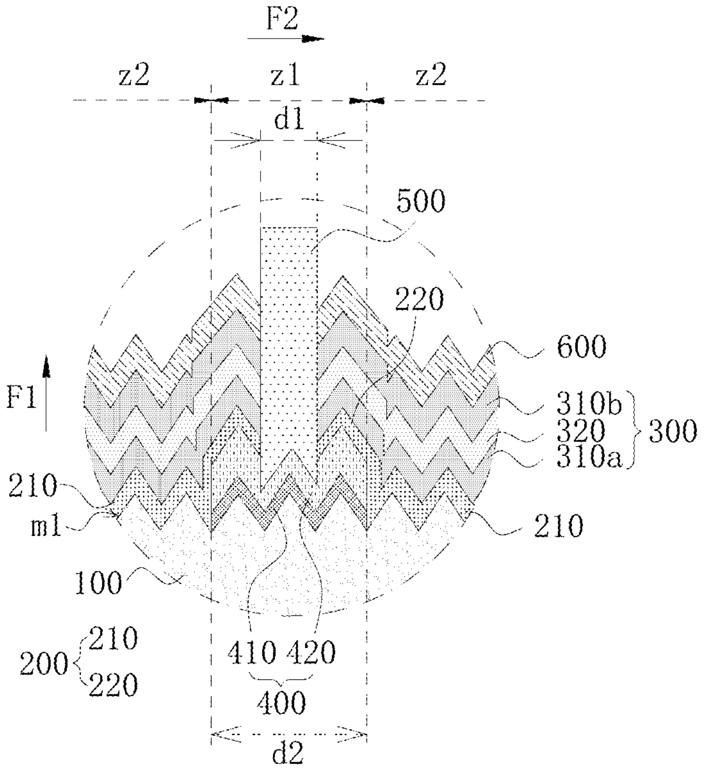
FIG. 6 is a partial enlarged view of area C in FIG. 5.

FIG. 3 is a schematic structural view of a solar cell in another embodiment of the present application. FIG. 4 is a partial enlarged view of area B in FIG. 3. FIG. 5 is a schematic structural view of a solar cell in yet another embodiment of the present application. FIG. 6 is a partial enlarged view of area C in FIG. 5. For clarity, only the features relevant to the embodiments of the present application are shown.

In some embodiments, referring to FIG. 3 to FIG. 6, the passivation medium layer 300 further includes a first passivation layer 320. The first passivation layer 320 mainly functions to provide surface passivation in the solar cell and can have a single-layer or multi-layer structure.

Specifically, in some embodiments, e.g., as shown in FIGS. 3 and 4, the passivation medium layer 300 includes a transparent conductive oxide layer 310 and a first passivation layer 320. The transparent conductive oxide layer 310 is disposed on a surface of the first tunnel oxide layer 200 away from the substrate 100, and the first passivation layer 320 is disposed on a surface of the transparent conductive oxide layer 310 away from the first tunnel oxide layer 200.

Specifically, in some embodiments, the passivation medium layer 300 includes at least one transparent conductive oxide layer 310 and at least one first passivation layer 320. When the solar cell includes a single transparent conductive oxide layer 310 and a single first passivation layer 320, the transparent conductive oxide layer 310 and the first passivation layer 320 are sequentially stacked along a direction, e.g., the first direction F1, away from the first tunnel oxide layer 200. When the solar cell includes two or more transparent conductive oxide layers 310 and two or more first passivation layers 320, the transparent conductive oxide layers 310 and the first passivation layers 320 are alternately stacked along the direction away from the first tunnel oxide layer 200.

It can be understood that alternate stacking refers to the arrangement that one first passivation layer 320 is sandwiched between two adjacent transparent conductive oxide layers 310. Thus, a stacked structure can be formed by sequentially stacking a transparent conductive oxide layer 310, a first passivation layer 320, a transparent conductive oxide layer 310, a first passivation layer 320, a transparent conductive oxide layer 310 . . . , and a last first passivation layer 320. Alternatively, there can be formed a stacked structure sequentially including a transparent conductive oxide layer 310, a first passivation layer 320, a transparent conductive oxide layer 310, a first passivation layer 320, a transparent conductive oxide layer 310 . . . , and a last transparent conductive oxide layer 310. In other words, in the passivation medium layer 300, the farthest layer from the first tunnel oxide layer 200 can be either a transparent conductive oxide layer 310 or a first passivation layer 320.

In some embodiments, e.g., as shown in FIGS. 5 and 6, the solar cell includes two transparent conductive oxide layers 310 and a single first passivation layer 320. The two transparent conductive oxide layers 310 include a first transparent conductive oxide layer 310*a* and a second transparent conductive oxide layer 310*b*. The first transparent conductive oxide layer 310*a*, the first passivation layer 320, and the second transparent conductive oxide layer 310*b* are sequentially stacked on the surface of the first tunnel oxide layer 200 away from the substrate 100.

The first passivation layer(s) 320 disposed between the transparent conductive oxide layers 310 in the passivation medium layer 300 can further improve the passivation effect on the first surface m1 of the substrate 100.

In some embodiments, referring to FIGS. 3 to 6, the material of the first passivation layer 320 includes aluminum oxide, silicon nitride, or a combination thereof. The material of the first passivation layer 320 can be selected according to actual needs.

In some embodiments, referring to FIGS. 3 to 6, the material of the transparent conductive oxide layer 310 can be aluminum-doped zinc oxide, and the material of the first passivation layer 320 can be aluminum oxide. Aluminum oxide can suppress hydrogen release, which ensures sufficient hydrogen passivation at the transparent conductive oxide layer 310 and the first tunnel oxide layer 200, therefore the synergistic effect between the transparent conductive oxide layer 310, which provides the field passivation, and the first passivation layer 320, which provides the hydrogen passivation, can further enhance the passivation effect, thereby significantly improving the conversion efficiency of the solar cell.

In some embodiments, referring to FIGS. 3 to 6, the thickness of the first passivation layer 320 is in a range from 1 nm to 20 nm. For example, the thickness of the first passivation layer 320 can be 1 nm, 2 nm, 3 nm, 5 nm, 6 nm, 7 nm, 8 nm, 9 nm, 10 nm, 12 nm, 14 nm, 15 nm, 17 nm, 18 nm, 19 nm, or 20 nm. The first passivation layer 320 within the range of thickness can provide adequate passivation effect and possess adequate carrier transporting capability.

In some embodiments, referring to FIGS. 1 to 6, the first surface m1 of the substrate 100 includes an electrode region z1 and a non-electrode region z2. The electrode region z1 is a region where any electrode is formed. The non-electrode region z2 is the region without any electrode, i.e., the region of the first surface m1 excluding the electrode region z1. Orthographic projections of the first tunnel oxide layer 200 and the passivation medium layer 300 on the first surface m1 include an overlapping region, and the overlapping region is located at least in the non-electrode region z2 of the first surface m1. The passivation medium layer 300 covers the surface of the first tunnel layer 200 away from the substrate 100, and the overlapping projection can be located at least in the non-electrode region z2 of the first surface m1, therefore the first tunnel oxide layer 200 and the passivation medium layer 300 are located in correspondence with at least the non-electrode region z2 of the first surface m1. In some embodiments, the overlapping projection can be located in both the non-electrode region z2 and the electrode region z1 of the first surface m1, and thus the first tunnel oxide layer 200 and the passivation medium layer 300 are located in correspondence with both the non-electrode region z2 and the electrode region z1 of the first surface m1.

FIGS. 1 to 6 show some embodiments in which the first tunnel oxide layer 200 and the passivation medium layer 300 are located in correspondence with both the non-electrode region z2 and the electrode region z1 of the first surface m1.

Since the first tunnel oxide layer 200 and the passivation medium layer 300 are located in correspondence with at least the non-electrode region z2 of the first surface m1, the carrier recombination in the non-electrode region z2 of the first surface m1 can be reduced, thereby improving the conversion efficiency of the solar cell. When the first tunnel oxide layer 200 and the passivation medium layer 300 are located in correspondence with both the non-electrode region z2 and the electrode region z1 of the first surface m1, the carrier recombination in both the electrode region z1 and the non-electrode region z2 of the first surface m1 can be further reduced, thereby further improving the conversion efficiency of the solar cell.

In some embodiments, referring to FIGS. 1 to 6, the solar cell further includes a first passivating contact layer 400, which is disposed on the first surface m1 and located in the electrode region z1. In some embodiments, the electrode region z1 and the non-electrode region z2 of the first surface m1 are defined by being with or without the first passivating contact layer 400. In other words, the region of the first surface m1 covered with the first passivating contact layer 400 is the electrode region z1, and the region of the first surface m1 not covered with the first passivating contact layer 400 is the non-electrode region z2.

The electrode formed on the first surface m1 can be in Ohmic contact with the first passivating contact layer 400. With the first passivating contact layer 400, the carrier recombination at the electrode region z1 of the first surface m1 can be reduced, while the contact between the electrode and the electrode region z1 of the first surface m1 can be improved, thereby greatly improving the conversion efficiency of the solar cell.

In some embodiments, referring to FIGS. 1 to 6, the first tunnel oxide layer 200 is in contact with the non-electrode region z2 of the first surface m1. The first passivating contact layer 400 is disposed on the first surface m1 and located in the electrode region z1, e.g., in contact with the electrode region z1 of the first surface m1.

Since the first passivating contact layer 400 is located in the electrode region z1 of the first surface m1, the electrode formed in the electrode region z1 can be in Ohmic contact with and thereby electrically connected to the first passivating contact layer 400, thereby improving the contact performance. In addition, as the first tunnel oxide layer 200 can be formed after removing the first passivating contact layer 400 in the non-electrode region z2, damage to the first tunnel oxide layer 200 can be reduced.

In some embodiments, referring specifically to FIGS. 2, 4 and 6, the first tunnel oxide layer 200 includes a first portion 210 located in the non-electrode region z2 and in contact with the first surface m1, and a second portion 220 located in the electrode region z1 and spaced from the first surface m1. The second portion 220 is disposed on a surface of the first passivating contact layer 400 away from the first surface m1. Correspondingly, the passivation medium layer 300 can also include two portions, which are a third portion disposed on a surface of the first portion 210 away from the substrate 100 and a fourth portion disposed on a surface of the second portion 220 away from the substrate 100. That is, the passivation medium layer 300 covers the entire surface of the first tunnel oxide layer 200 away from the substrate 100.

By having the above structure, the part of the electrode region z1 of the first surface m1 that is not covered with the electrode can be covered with the first tunnel oxide layer 200 and the passivation medium layer 300, so that the carrier recombination in the electrode region z1 can be further reduced and the efficiency of the solar cell can be enhanced.

Figure 7:
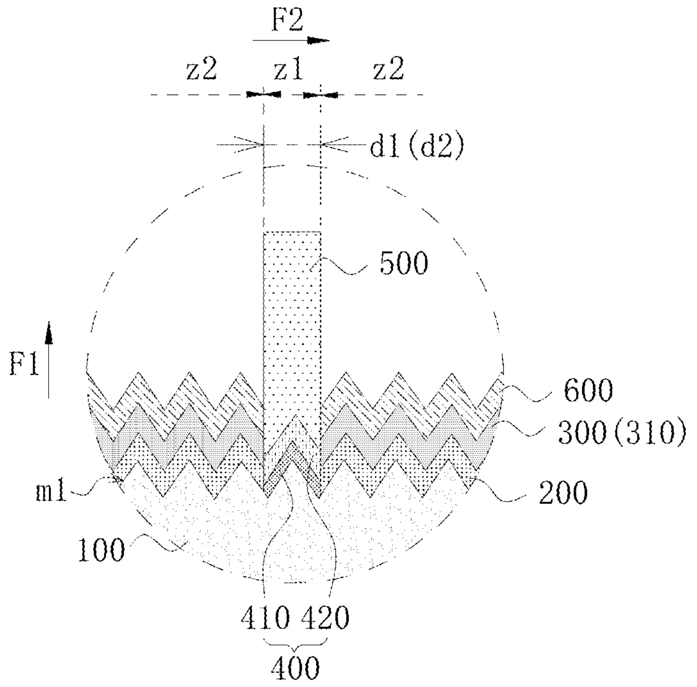
FIG. 7 is a partial enlarged view of a solar cell in yet another embodiment of the present application.
Figure 8:
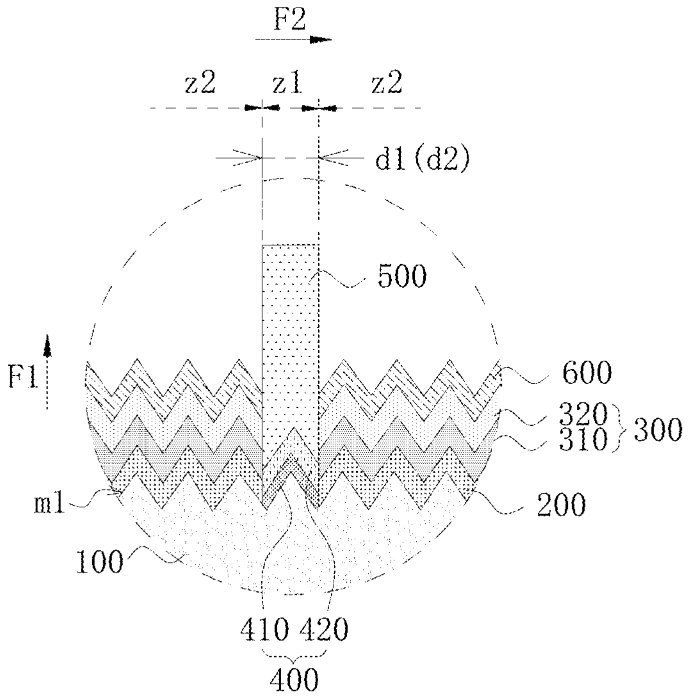
FIG. 8 is a partial enlarged view of a solar cell in yet another embodiment of the present application.

Referring to FIG. 7 and FIG. 8, in some other embodiments, different from the embodiments in FIG. 2 and FIG. 4, the first tunnel oxide layer 200 is only located in the non-electrode region z2 of the first surface m1, and the first tunnel oxide layer 200 is in contact with the non-electrode region z2 of the first surface m1. In other words, the first tunnel oxide layer 200 only includes the first portion 210. In these embodiments, the solar cell can include the first passivating contact layer 400, and the first passivating contact layer 400 is disposed on the first surface m1 and located in the electrode region z1. However, the surface of the first passivating contact layer 400 away from the first surface m1 is not covered with the first tunnel oxide layer 200. In some embodiments, the first passivating contact layer 400 away from the first surface m1 is entirely covered with the electrode. Correspondingly, the passivation medium layer 300 is only located in the non-electrode region z2 of the first surface m1, only including the third portion.

In some embodiments, referring to FIGS. 2, 4, 6, and 8, the first passivating contact layer 400 includes a second tunnel oxide layer 410 and a first doped semiconductor layer 420, which are sequentially stacked on the first surface in the electrode region. The first doped semiconductor layer 420 can be an n-type doped semiconductor layer or a p-type doped semiconductor layer. In some embodiments, the n-type doped semiconductor layer can be an n-type amorphous silicon layer, an n-type microcrystalline silicon layer, an n-type polysilicon layer, or an n-type nanocrystalline silicon layer, which can be selected according to actual needs and is not limited herein. In a specific embodiment, the first doped semiconductor layer 420 is an n-type doped polysilicon layer.

The second tunnel oxide layer 410 is adapted to provide surface passivation, and the first doped semiconductor layer 420 can act as a carrier-selective contact material. As such, the second tunnel oxide layer 410 and the first doped semiconductor layer 420 together form a passivating contact structure on the first surface m1 in the electrode region z1, thereby reducing carrier recombination and providing good contact performance, and thus improving the efficiency of the solar cell and facilitating the formation of the electrode in the electrode region z1 on the first surface m1.

In some embodiments, referring to FIGS. 2, 4, 6, and 8, a thickness of the second tunnel oxide layer 410 is in a range from 0.8 nm to 2 nm. For example, the thickness of the second tunnel oxide layer 410 can be 0.8 nm, 0.9 nm, 1 nm, 1.1 nm, 1.3 nm, 1.4 nm, 1.6 nm, 1.9 nm, or 2 nm.

The second tunnel oxide layer 410 within the range of thickness can provide an adequate passivation effect and have a reduced contact resistance, thereby preventing the decrease in the fill factor of the solar cell caused by the contact resistance.

In some embodiments, referring to FIGS. 2, 4, 6, and 8, a thickness of the first doped semiconductor layer 420 is in a range from 10 nm to 500 nm. For example, the thickness of the first doped semiconductor layer 420 can be 10 nm, 20 nm, 30 nm, 50 nm, 70 nm, 80 nm, 90 nm, 100 nm, 110 nm, 120 nm, 170 nm, 190 nm, 200 nm, 210 nm, 220 nm, 270 nm, 290 nm, 300 nm, 310 nm, 320 nm, 370 nm, 390 nm, 400 nm, 410 nm, 420 nm, 470 nm, 490 nm, or 500 nm.

The first doped semiconductor layer 420 within the range of thickness can selectively transport charge carriers, reducing recombination loss, and also can reduce optical absorption path, reducing parasitic light absorption, thereby improving the conversion efficiency of the solar cell.

Additionally, compared with the passivating contact structure including a doped polysilicon conductive layer and a tunnel oxide layer in related art, the passivating contact structure including the first tunnel oxide layer 200 and the first passivation layer 320 located at least in the non-electrode region z2 of the first surface m1 can reduce carrier recombination. Meanwhile, the first doped semiconductor layer 420 is located only in the electrode region z1 of the first surface m1, and thus the area of the first doped semiconductor layer 420 can be reduced, which reduces parasitic light absorption of the first doped semiconductor layer 420 while facilitating the fabrication of the electrode on the electrode region z1 of the first surface m1.

Figure 9:
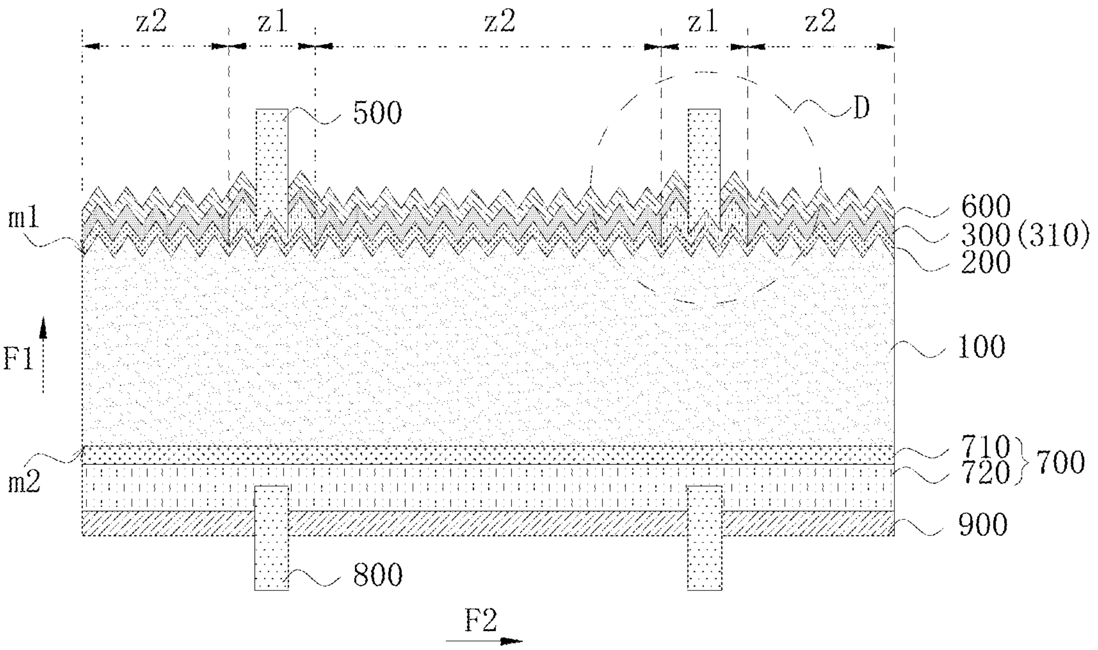
FIG. 9 is a schematic structural view of a solar cell in yet another embodiment of the present application.
Figure 10:
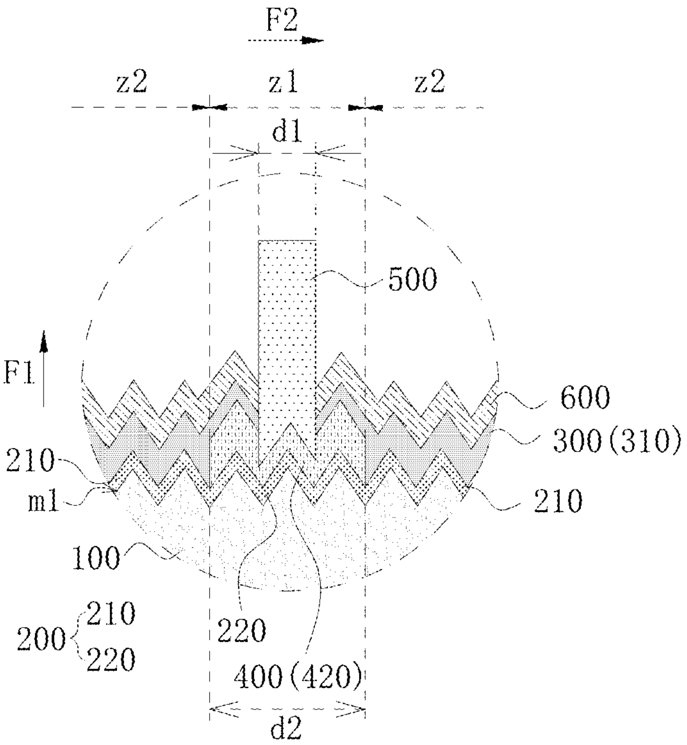
FIG. 10 is a partial enlarged view of area D in FIG. 9.

FIG. 9 is a schematic structural view of a solar cell in yet another embodiment of the present application. FIG. 10 is a partial enlarged view of area D in FIG. 9. FIG. 11 is a partial enlarged view of a solar cell in yet another embodiment of the present application. For clarity, only the features relevant to the embodiments of the present application are shown.

In some embodiments, referring to FIG. 9 to FIG. 11, the first tunnel oxide layer 200 includes a first portion 210 located on and in contact with the non-electrode region z2 of the first surface m1, and a second portion 220 located on and in contact with the electrode region z1 of the first surface m1. That is, the first tunnel oxide layer 200 covers the first surface m1, and the entirety of the first tunnel oxide layer 200 can be in contact with the first surface m1. The first passivating contact layer 400 is located in the electrode region z1 and disposed on a surface of the second portion 220 away from the substrate 100. That is, the first passivating contact layer 400 is spaced from the first surface m1 of the substrate 100 by the second portion 220 of the first tunnel oxide layer 200.

Referring to FIG. 10, in some embodiments, the first passivating contact layer 400 includes a first doped semiconductor layer 420, which is disposed on the surface of the second portion 220 away from the substrate 100. The first doped semiconductor layer 420 and the second portion 220 of the first tunnel oxide layer 200 can form a passivating contact structure. Referring to FIG. 11, in some other embodiments, the first passivating contact layer 400 includes a first doped semiconductor layer 420 and a second tunnel oxide layer 410. The second tunnel oxide layer 410 is disposed on a surface of the first doped semiconductor layer 420 away from the second portion 220. That is, the first doped semiconductor layer 420 and the second tunnel oxide layer 410 are sequentially stacked on the surface of the second portion 220 away from the substrate 100. The first doped semiconductor layer 420 and the second tunnel oxide layer 410 form a passivating contact structure, and the first passivating contact layer 400 and the first tunnel oxide layer 200 also can be seen as forming another passivating contact structure. The other features of the second tunnel oxide layer 410 and the first doped semiconductor layer 420 can be referred to those described in the above embodiments, and are not repeated herein.

Thus, the passivating contact structure can be flexibly formed through the first passivating contact layer 400 and the first tunnel oxide layer 200 as described in the above embodiments.

It can be understood that in the embodiments in FIGS. 2, 4, 6, and 11, a passivating contact structure is formed to include the first doped semiconductor layer 420 disposed between the second portion 220 of the first tunnel layer and the second tunnel oxide layer 410. Compared with the embodiments in FIGS. 10 and 11, the embodiments in FIGS. 2, 4, and 6 are easier to be fabricated.

In some embodiments, referring to FIGS. 1 to 11, the solar cell further includes a first electrode 500. An orthographic projection of the first electrode 500 on the first surface m1 is located in the electrode region z1 of the first surface m1. The first electrode 500 is in Ohmic contact with the first passivating contact layer 400. Specifically, the first electrode 500 is formed corresponding to the electrode region z1 of the first surface m1, and the first electrode 500 can be in contact with but not penetrating through the first doped semiconductor layer 420, thereby maintaining a good interface passivation.

Referring to FIGS. 1 to 6, in the embodiments where the second portion 220 of the first tunnel oxide layer 200 is disposed on the surface of the first passivating contact layer 400 away from the first surface m1, the first electrode 500 can penetrate sequentially through the passivation medium layer 300 and the first tunnel oxide layer 200, and come into contact with the first doped semiconductor layer 420. Referring to FIGS. 7 and 8, in the embodiments where the first tunnel oxide layer 200 and the passivation medium layer 300 are located only in the non-electrode region z2 of the first surface m1, the first electrode 500 can be in contact with the first doped semiconductor layer 420. Referring to FIGS. 10 and 11, in the embodiments where the first tunnel oxide layer 200 is also in contact with the electrode region z1 of the first surface m1, the first tunnel oxide layer 200 can penetrate through the passivation medium layer 300 and come into contact with the first doped semiconductor layer 420, or the first tunnel oxide layer 200 can sequentially penetrate through the passivation medium layer 300 and the second tunnel oxide layer 410, and come into contact with the first doped semiconductor layer 420.

As some examples, the first electrode 500 can be made of a metal material, including one or more conductive metals, such as Ag, Ni, Cu, Sn, Al, etc., which can be selected according to actual needs and is not limited herein.

In some embodiments, referring to FIGS. 2, 4, and 6 to 8, a second direction F2 can be the width direction of the first electrode 500 and perpendicular to the first direction F1. Along the width direction of the first electrode 500, a size ratio of the first electrode 500 to the first passivating contact layer 400 is greater than 0 and less than or equal to 1. That is, the size of the first electrode 500 along the second direction F2 is a first size d1, and the size of the first passivating contact layer 400 along the second direction F2 is a second size d2, and the ratio of the first size d1 to the second size d2 is greater than 0 and less than or equal to 1, e.g., can be 0.1, 0.2, 0.3, 0.4, 0.5, 0.6, 0.7, 0.8, 0.9, or 1.

In the embodiments in FIGS. 2, 4, and 6, the first size d1 is smaller than the second size d2. In the embodiments in FIGS. 7 and 8, the first size d1 is equal to the second size d2. In the embodiments in FIGS. 7 and 8, the first tunnel oxide layer 200 is located in the non-electrode region z2 of the first surface m1 and is in contact with the non-electrode region z2 of the first surface m1.

It can be understood that, since the first passivating contact layer 400 in some embodiments is located in the electrode region z1 of the first surface m1, the size of the electrode region z1 of the first surface m1 can be represented by the second size d2. In the embodiments where the first passivating contact layer 400 includes the second tunnel oxide layer 410 and the first doped semiconductor layer 420, the size of the second tunnel oxide layer 410 and the size of the first doped semiconductor layer 420 along the second direction F2 can both be the second size d2.

The ratio of the first size d1 to the second size d2 within the above range facilitates the fabrication of the first electrode 500 and improves the conversion efficiency of the solar cell.

In some embodiments, referring to FIGS. 1 to 11, the solar cell further includes a second passivation layer 600. The second passivation layer 600 is disposed on a surface of the passivation medium layer 300 away from the first tunnel oxide layer 200. Specifically, in some embodiments, e.g., as shown in FIGS. 1, 2, and 7, the second passivation layer 600 is disposed on a surface of the transparent conductive oxide layer 310 away from the first tunnel oxide layer 200. In some embodiments, e.g., as shown in FIGS. 3, 4, and 8, the second passivation layer 600 is disposed on a surface of the first passivation layer 320 away from the transparent conductive oxide layer 310. In some embodiments, e.g., as shown in FIGS. 5 and 6, the second passivation layer 600 is disposed on a surface of the second transparent conductive oxide layer 310*b* away from the first passivation layer 320. The first electrode 500 can penetrate through the second passivation layer 600, the passivation medium layer 300, and the first tunnel oxide layer 200, and come into contact with the first doped semiconductor layer 420.

The second passivation layer 600 mainly functions as surface passivation and anti-reflection in the solar cell. The second passivation layer 600 can chemically passivate the dangling bonds on the surface of the substrate 100 and have an anti-reflection effect. The second passivation layer 600 can be a single-layer structure or a multi-layer structure. The material of the second passivation layer 600 can be at least one of aluminum oxide, silicon oxide, silicon nitride, or silicon oxynitride. In a specific embodiment, the material of the second passivation layer 600 is silicon nitride.

In some embodiments, referring to FIGS. 1, 3, 5, and 9, the solar cell further includes a second passivating contact layer 700. The second passivating contact layer 700 is disposed on the second surface m2 of the substrate 100.

The electrode formed on the second surface m2 can be in Ohmic contact with and thus electrically connected to the second passivation contact layer 700. Thus, the carrier recombination at the second surface m2 can be reduced, while the contact between the electrode and the second surface m2 can be improved, thereby greatly improving the conversion efficiency of the solar cell.

In some embodiments, the second passivation contact layer 700 includes a third tunnel oxide layer 710 and a second doped semiconductor layer 720 stacked in sequence on the second surface m2 of the substrate 100. The second doped semiconductor layer 720 can be an n-type doped semiconductor layer or a p-type doped semiconductor layer. In some embodiments, the p-type doped semiconductor layer can be a p-type amorphous silicon layer, a p-type microcrystalline silicon layer, a p-type polysilicon layer, or a p-type nanocrystalline silicon layer, which can be selected according to actual needs and is not limited herein. In a specific embodiment, the second doped semiconductor layer 720 is a p-type doped semiconductor layer.

The third tunnel oxide layer 710 is adapted to provide surface passivation, and the second doped semiconductor layer 720 can act as a carrier-selective contact material. As such, the third tunnel oxide layer 710 and the second doped semiconductor layer 720 together form a passivating contact structure on the second surface m2, thereby reducing carrier recombination and providing good contact performance, thus improving the efficiency of the solar cell and facilitating the formation of the electrode on the second surface m2.

In some embodiments, referring to FIGS. 1, 3, 5, and 9, a thickness of the third tunnel oxide layer 710 is in a range from 0.8 nm to 2 nm. For example, the thickness of the third tunnel oxide layer 710 can be 0.8 nm, 0.9 nm, 1 nm, 1.1 nm, 1.3 nm, 1.4 nm, 1.6 nm, 1.9 nm, or 2 nm.

The third tunnel oxide layer 710 within the range of thickness can provide an adequate passivation effect and have a reduced contact resistance, thereby preventing the decrease in the fill factor of the solar cell caused by the contact resistance.

In some embodiments, referring to FIGS. 1, 3, 5, and 9, a thickness of the second doped semiconductor layer 720 is in a range of 10 nm to 1000 nm. For example, the thickness of the second doped semiconductor layer 720 can be 10 nm, 20 nm, 30 nm, 50 nm, 70 nm, 80 nm, 90 nm, 100 nm, 110 nm, 120 nm, 170 nm, 190 nm, 200 nm, 210 nm, 220 nm, 270 nm, 290 nm, 300 nm, 310 nm, 320 nm, 370 nm, 390 nm, 400 nm, 410 nm, 420 nm, 470 nm, 490 nm, 500 nm, 510 nm, 520 nm, 570 nm, 590 nm, 600 nm, 610 nm, 620 nm, 670 nm, 690 nm, 700 nm, 710 nm, 720 nm, 770 nm, 790 nm, 800 nm, 810 nm, 820 nm, 870 nm, 890 nm, 900 nm, 910 nm, 920 nm, 970 nm, 990 nm, or 1000 nm.

The second doped semiconductor layer 720 within the range of thickness can selectively transport charge carriers, reducing recombination loss, and also can reduce optical absorption path, reducing parasitic light absorption, thereby improving the conversion efficiency of the solar cell.

In some embodiments, referring to FIGS. 1, 3, 5, and 9, the solar cell further includes a second electrode 800. The second electrode 800 is disposed on the second surface m2 of the substrate 100, and is in Ohmic contact with the second passivation contact layer 700. Specifically, the second electrode 800 can be in contact with but not penetrating through the second doped semiconductor layer 720, thereby maintaining good interface passivation.

As some examples, the second electrode 800 can be made of a metal material, including one or more conductive metals, such as Ag, Ni, Cu, Sn, Al, etc., which can be selected according to actual needs and is not limited herein.

In some embodiments, referring to FIGS. 1, 3, 5, and 9, the solar cell further includes a third passivation layer 900. The third passivation layer 900 is disposed on a surface of the second passivating contact layer 700 away from the substrate 100. Specifically, the third passivation layer 900 is disposed on a surface of the second doped semiconductor layer 720 away from the third tunnel oxide layer 710. The second electrode 800 can penetrate through the third passivation layer 900 and come into contact with the second doped semiconductor layer 720.

The third passivation layer 900 mainly functions as surface passivation and anti-reflection in the solar cell. The third passivation layer 900 can chemically passivate the dangling bonds on the surface of the substrate 100 and have an anti-reflection effect. The third passivation layer 900 can be a single-layer structure or a multi-layer structure. The material of the third passivation layer 900 can be at least one of aluminum oxide, silicon oxide, silicon nitride, or silicon oxynitride. In a specific embodiment, the material of the third passivation layer 900 is silicon nitride.

In some embodiments, referring to FIGS. 1 to 11, a thickness of the first tunnel oxide layer 200 is in a range from 0.8 nm to 2 nm. For example, the thickness of the first tunnel oxide layer 200 can be 0.8 nm, 0.9 nm, 1 nm, 1.1 nm, 1.3 nm, 1.4 nm, 1.6 nm, 1.9 nm, or 2 nm.

The first tunnel oxide layer 200 within the range of thickness can provide an adequate passivation effect and have a reduced contact resistance, thereby preventing the decrease in the fill factor of the solar cell caused by the contact resistance.

FIG. 12 shows a flow chart of a method for preparing a solar cell in an embodiment of the present application. For clarity, only relevant features are shown.

Referring to FIG. 12 in combination with FIGS. 1 to 11, based on the same inventive concept, an embodiment of the present application provides a method for preparing a solar cell, and the method includes steps of:

SF, providing a substrate 100 including a first surface m1 and a second surface m2 opposite to the first surface m1; and SG, sequentially forming a first tunnel oxide layer 200 and a passivation medium layer 300 on the first surface m1 of the substrate 100, where the first tunnel oxide layer 200 is at least partially in contact with the first surface m1, the passivation medium layer 300 is formed on a surface of the first tunnel oxide layer 200 away from the substrate 100, and the passivation medium layer 300 at least includes a transparent conductive oxide layer 310.

In step SF, a silicon wafer as the substrate 100 can be cleaned, textured, and at least one surface of the silicon wafer in the thickness direction can be polished to form the second surface m2 of the substrate 100. As such, in some embodiment, e.g., shown in FIGS. 1 to 8, a textured structure is formed in the first surface m1 of the substrate 100. The texturing is optional and can be performed or not according to actual needs, and is not limited herein.

In step SG, the first tunnel oxide layer 200 can be formed by using a method involving thermal oxidation, plasma oxidation, and/or nitric acid oxidation; the transparent conductive oxide layer 310 can be formed by using a method involving atomic layer deposition and/or physical vapor deposition.

The structures and materials of the substrate 100, the first tunnel oxide layer 200, the passivation medium layer 300, and the transparent conductive oxide layer 310 have been described above and are not repeated herein.

The effects of the solar cell prepared by the method can be referred to those described in the above embodiments of the solar cell, and are not repeated herein.

Figure 13:
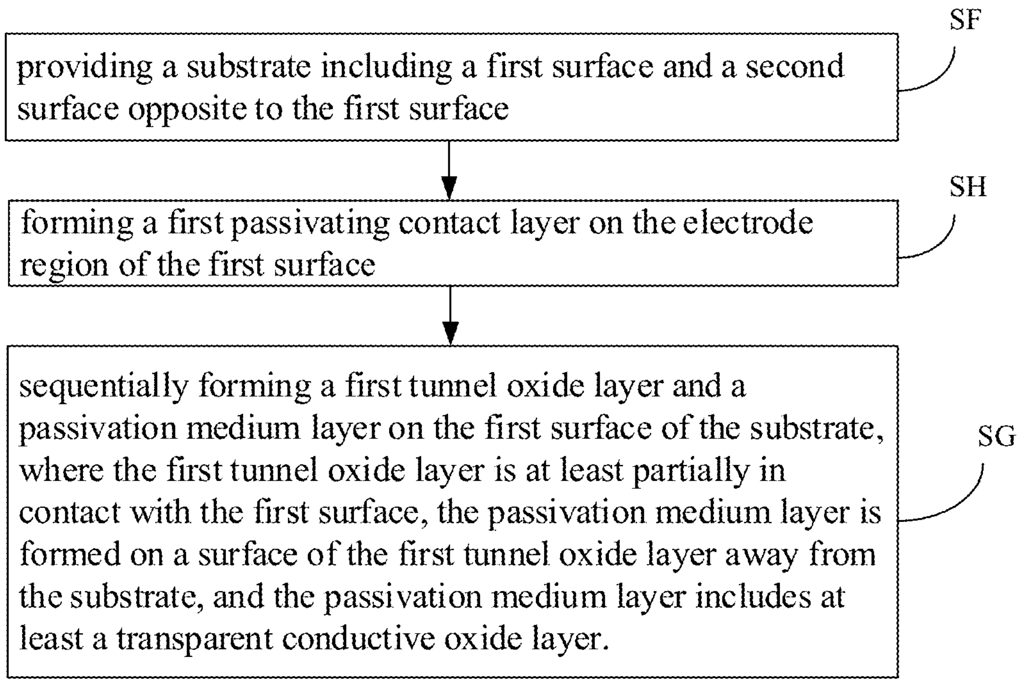
FIG. 13 shows a flow chart of a method for preparing a solar cell including step SH in an embodiment of the present application.

FIG. 13 shows a flow chart of a method for preparing a solar cell including step SH in an embodiment of the present application. For clarity, only relevant features are shown.

In some embodiments, referring to FIG. 13 in combination with FIGS. 1 to 8, the first surface m1 of the substrate 100 includes an electrode region z1 and a non-electrode region z2. The first tunnel oxide layer 200 is in contact with the non-electrode region z2 of the first surface m1. Before step SG, the method further includes:

SH, forming a first passivating contact layer 400 on the first surface m1 in the electrode region z1.

In step SH, the first passivating contact layer 400 can be firstly formed on the first surface m1 of the substrate 100, and then the portion of the first passivating contact layer 400 located in the non-electrode region z2 of the first surface m1 can be removed using laser etching or chemical etching, leaving the other portion of the first passivating contact layer 400 located in the electrode region z1 of the first surface m1. For example, the structures as shown in FIGS. 2, 4, and 6 to 8 can be formed by the methods including such a step.

It can be understood that in the embodiments shown in FIGS. 2, 4, and 6, as the first tunnel oxide layer 200 is formed after the removal step, such as the laser or chemical etching step, thus avoiding the damage to the first tunnel oxide layer 200 in the removal step, and improving the passivation performance of the first tunnel oxide layer 200. Additionally, since the size of the electrode region z1 along the second direction F2 is greater than the size of the electrode along the second direction F2 (i.e., the width of the electrode) on the first surface m1, the process window for forming the electrode can be increased. Furthermore, when the first passivating contact layer 400 includes the first doped semiconductor layer 420, as the first doped semiconductor layer 420 has relatively good thermal endurance, the contact performance of the electrode can be improved.

When the first passivating contact layer 400 includes the first doped semiconductor layer 420 and/or the second tunnel oxide layer 410, the first doped semiconductor layer 420 can be formed by using low-pressure chemical vapor deposition (LPCVD), plasma-enhanced chemical vapor deposition (PECVD), or physical vapor deposition (PVD). The processes for forming the second tunnel oxide layer 410 can be referred to those described above for forming the first tunnel oxide layer 200, and are not repeated herein.

In some other embodiments, the first tunnel oxide layer 200 can be firstly formed on the first surface m1 of the substrate 100, and then the first passivating contact layer 400 can be formed on the electrode region z1 of the first surface m1. For example, the structures as shown in FIGS. 10 and 11 can be formed by the methods including such a step. The features of the first passivating contact layer 400 can be referred to those described in the above embodiments, and are not repeated herein. In the embodiments shown in FIGS. 2, 4, and 6, the sidewall of the first doped semiconductor layer 420 is in contact with the first tunnel oxide layer 200. The first doped semiconductor layer 420 is covered by the first tunnel oxide layer 200. In the subsequent process of forming the first electrode 500, the first electrode 500 penetrates through the second portion 220 of the first tunnel oxide layer 200 and then comes into Ohmic contact with the first doped semiconductor layer 420. In the embodiments shown in FIGS. 10 and 11, the sidewall of the first doped semiconductor layer 420 is in contact with the transparent conductive oxide layer 310. The first doped semiconductor layer 420 is disposed on the first tunnel oxide layer 200, and the exposed surface of the first doped semiconductor layer 420 is covered by the transparent conductive oxide layer 310. In the subsequent process of forming the first electrode 500, the first electrode 500 penetrates through the transparent conductive oxide layer 310 and then comes into Ohmic contact with the first doped semiconductor layer 420.

It should be noted that the features of the first passivating contact layer 400 and the structure formed by the first passivating contact layer 400 and the first tunnel oxide layer 200 can be referred to those described in the above relevant embodiments of the solar cell, and are not repeated herein.

Figure 14:
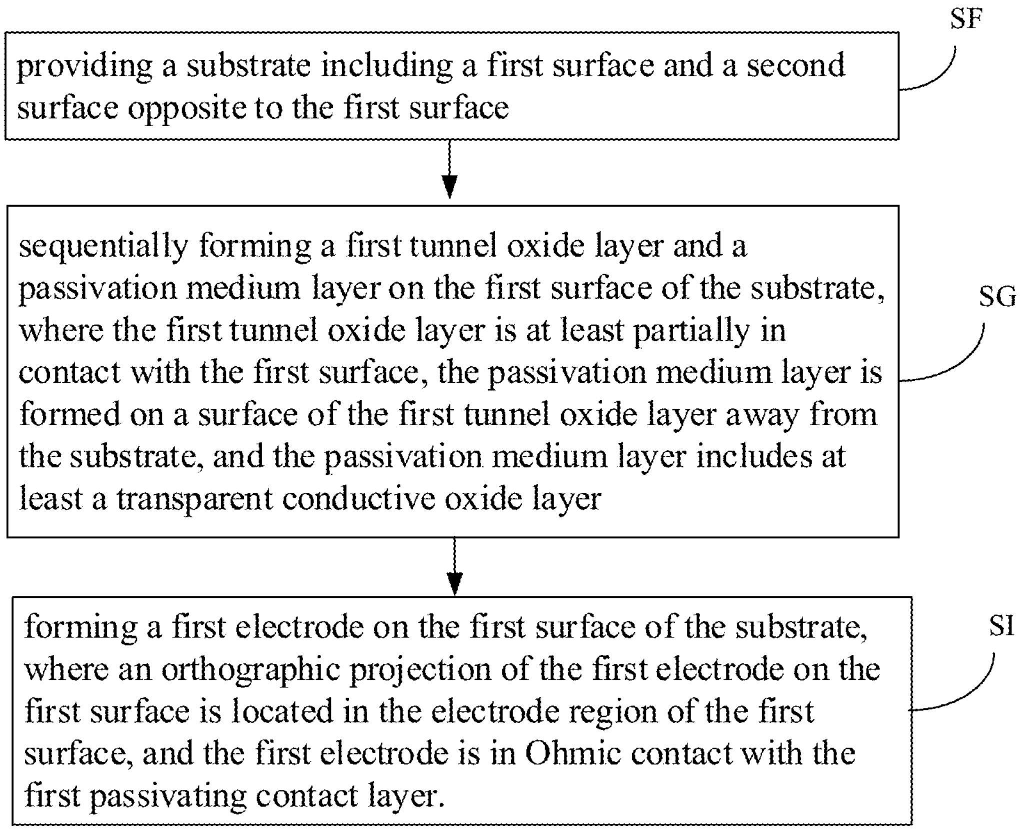
FIG. 14 shows a flow chart of a method for preparing a solar cell including step SI in an embodiment of the present application.

FIG. 14 shows a flow chart of a method for preparing a solar cell including step SI in an embodiment of the present application. For clarity, only relevant features are shown.

In some embodiments, referring to FIG. 14 in combination with FIGS. 1 to 11, after SG, the method includes:

SI, forming the first electrode 500 on the first surface m1 of the substrate 100, where an orthographic projection of the first electrode 500 on the first surface m1 is located in the electrode region z1 of the first surface m1, and the first electrode 500 is in Ohmic contact with the first passivating contact layer 400.

In step SI, the first electrode 500 can be formed by the method such as screen printing, electroplating, or laser transfer printing, and is not specifically limited herein.

The features of the first electrode 500 can be referred to those described in the above relevant embodiments of the solar cell, and are not repeated herein.

Figure 15:
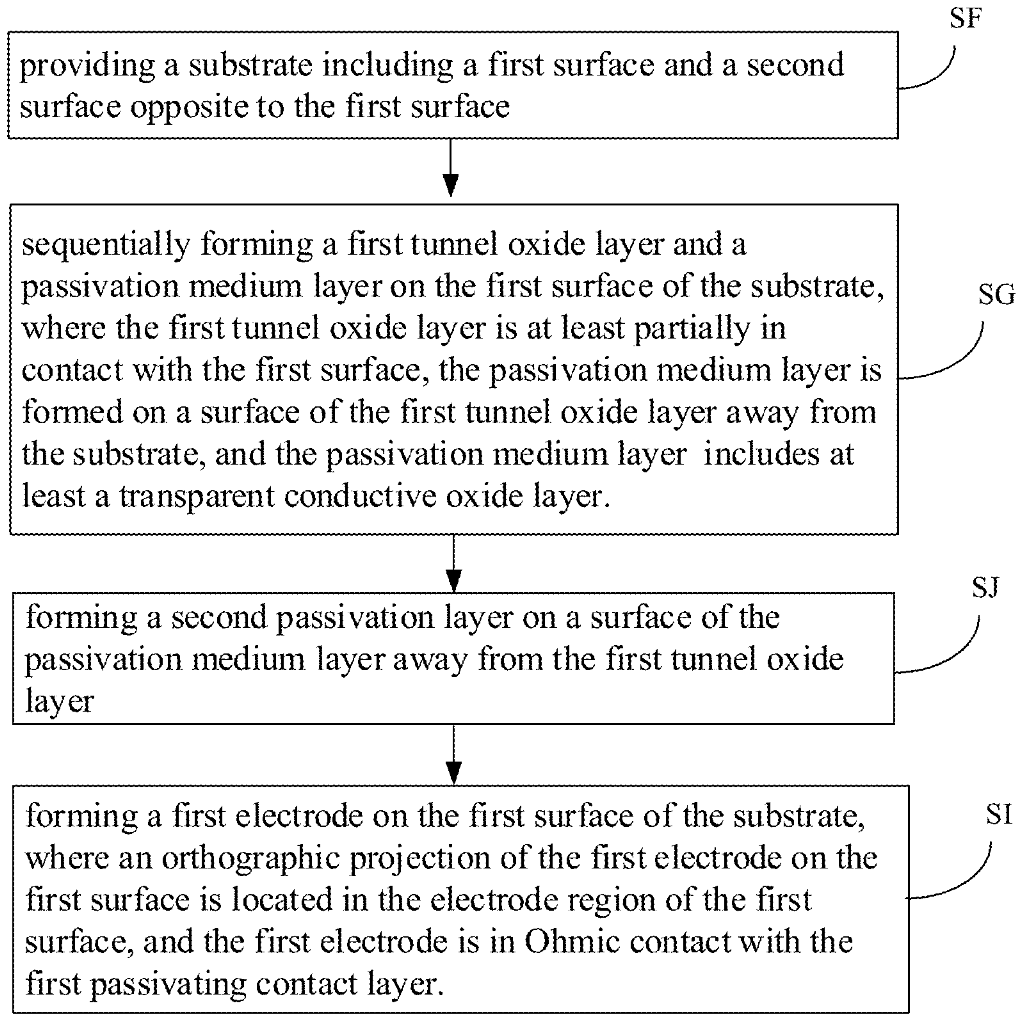
FIG. 15 shows a flow chart of a method for preparing a solar cell including step SJ in an embodiment of the present application.

FIG. 15 shows a flow chart of a method for preparing a solar cell including step SJ in an embodiment of the present application. For clarity, only relevant features are shown.

In some embodiments, referring to FIG. 15 in combination with FIGS. 1 to 11, after SG, the method includes:

SJ, forming a second passivation layer 600 on a surface of the passivation medium layer 300 away from the first tunnel oxide layer 200.

Step SJ can be performed before step SI to facilitate the forming process. Correspondingly, the first electrode 500 can firstly penetrate through the second passivation layer 600, and then penetrate through at least the passivation medium layer 300, and finally come into Ohmic contact with the first doped semiconductor layer 420.

The features of the second passivation layer 600 can be referred to those described in the above embodiments, and are not repeated herein.

Figure 16:
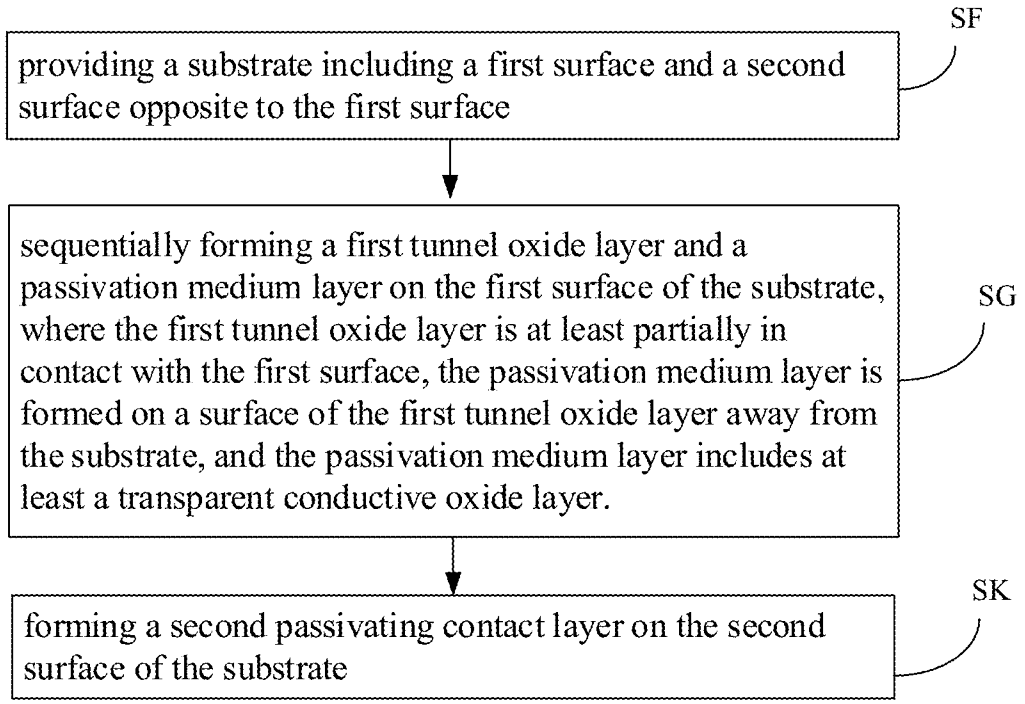
FIG. 16 shows a flow chart of a method for preparing a solar cell including step SK in an embodiment of the present application.

FIG. 16 shows a flow chart of a method for preparing a solar cell including step SK in an embodiment of the present application. For clarity, only relevant features are shown.

In some embodiments, referring to FIG. 16 in combination with FIGS. 1, 3, 5, and 9, the method further includes:

SK, forming a second passivating contact layer 700 on the second surface m2 of the substrate 100.

The features of the second passivating contact layer 700 can be referred to those described in the above embodiments, and are not repeated herein.

It should be noted that step SK can be performed before step SG or after step SG. When the second passivating contact layer 700 includes a third tunnel oxide layer 710, the step of forming the third tunnel oxide layer 710 can be performed simultaneously with or separately from the step of forming the first tunnel oxide layer 200 or the step of forming the second tunnel oxide layer 410, which can be decided according to actual structural needs and is not limited herein. When the second passivating contact layer 700 includes a third tunnel oxide layer 710 and a second doped semiconductor layer, these layers can be formed according to the processes for forming similar layers in the above embodiments.

Figure 17:
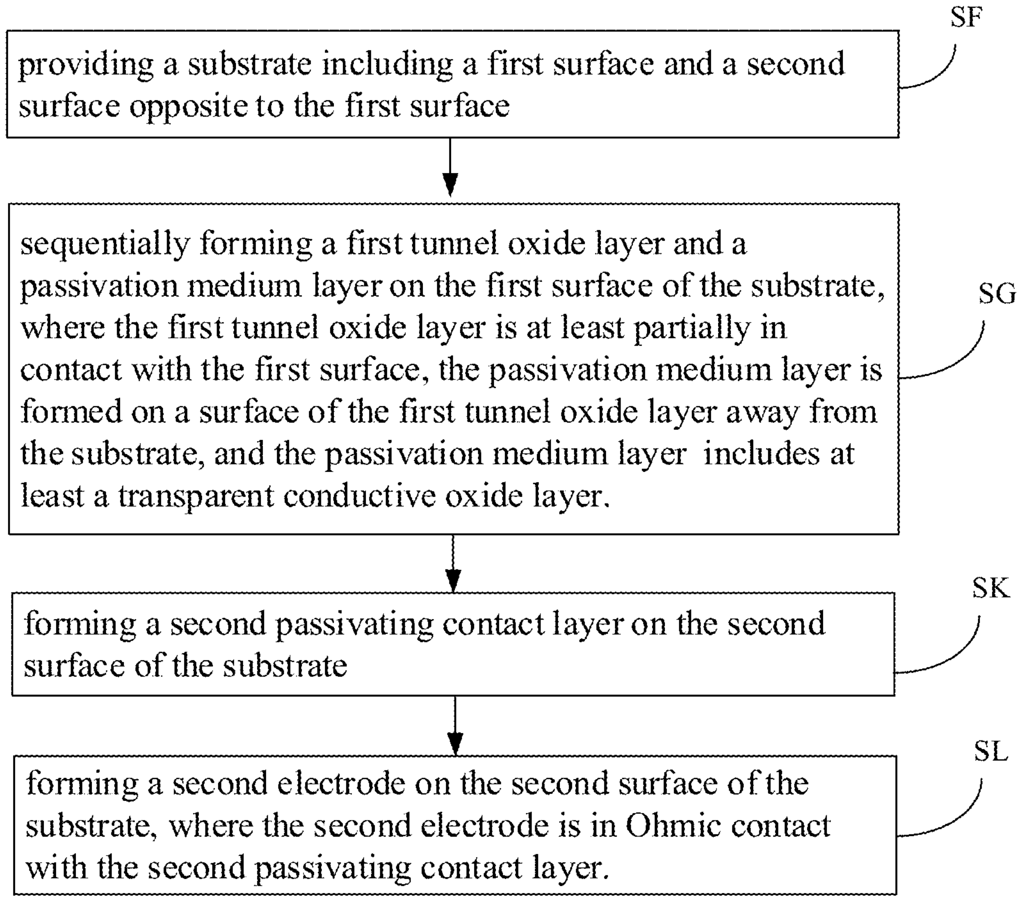
FIG. 17 shows a flow chart of a method for preparing a solar cell including step SL in an embodiment of the present application.

FIG. 17 shows a flow chart of a method for preparing a solar cell including step SL in an embodiment of the present application. For clarity, only relevant features are shown.

In some embodiments, referring to FIG. 17 in combination with FIGS. 1, 3, 5, and 9, after step SK, the method includes:

SL, forming a second electrode 800 on the second surface m2 of the substrate 100, where the second electrode 800 is in Ohmic contact with the second passivating contact layer 700.

The features of the second electrode 800 can be referred to those described in the above embodiments, and are not repeated herein.

Figure 18:
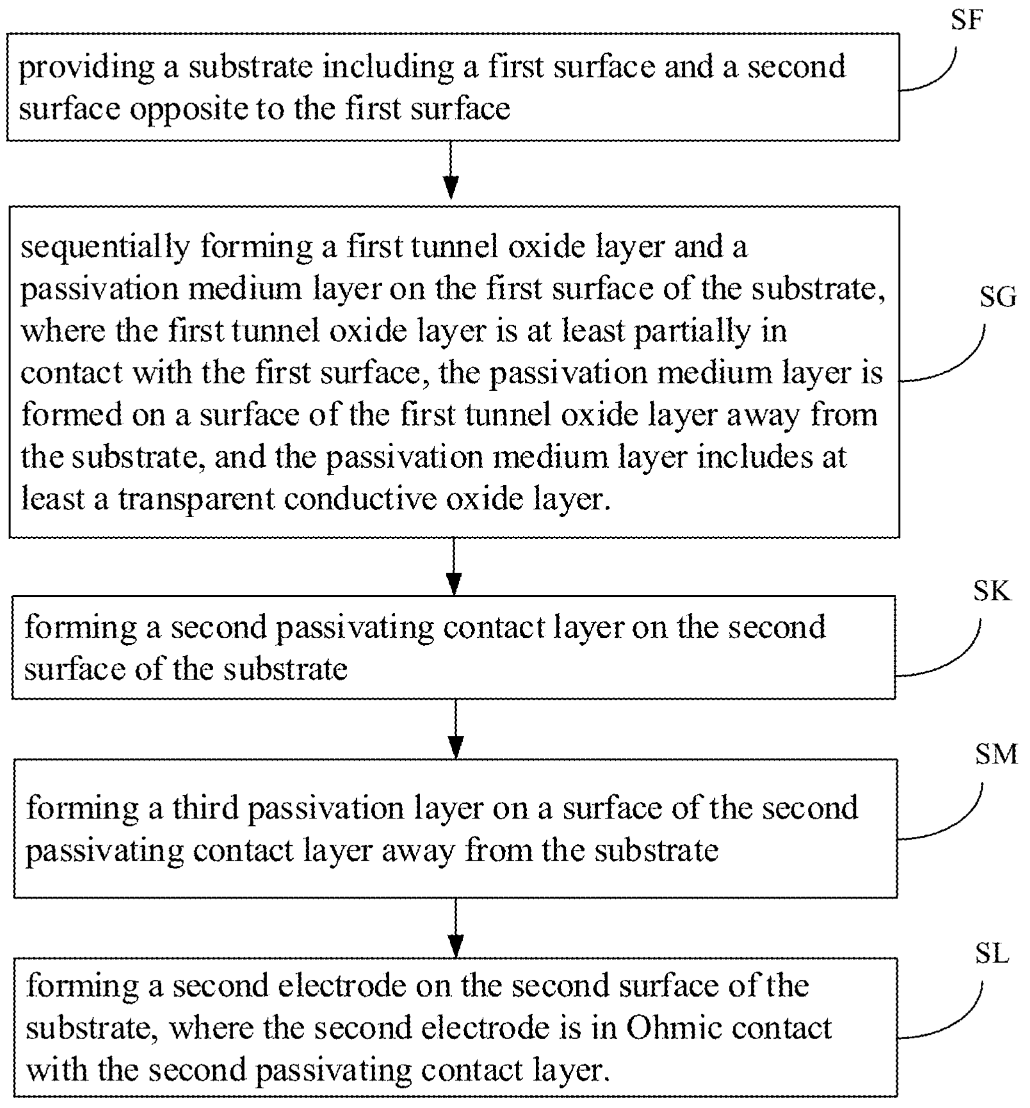
FIG. 18 shows a flow chart of a method for preparing a solar cell including step SM in an embodiment of the present application.

FIG. 18 shows a flow chart of a method for preparing a solar cell including step SM in an embodiment of the present application. For clarity, only relevant features are shown.

In some embodiments, referring to FIG. 17 in combination with FIGS. 1, 3, 5, and 9, after step SK, the method further includes:

SM, forming a third passivation layer 900 on a surface of the second passivating contact layer 700 away from the substrate 100.

The features of the third passivation layer 900 can be referred to those described in the above embodiments, and are not repeated herein.

Referring to FIGS. 1 to 6, in a specific embodiment, a method for preparing a solar cell includes following steps:

step 1, cleaning and texturing a silicon wafer, and polishing one surface of the silicon wafer, where the polished surface forms the first surface m1 of the substrate 100, and the textured surface forms the second surface m2 of the substrate 100;

step 2, forming a first passivating contact layer 400 in the electrode region z1 on the first surface m1 of the substrate 100;

step 3, sequentially forming a first tunnel oxide layer 200 and a passivation medium layer 300 on the first surface m1 of the substrate 100, where the first tunnel oxide layer 200 includes a first portion 210 in contact with the non-electrode region z2 of the first surface m1 and a second portion 220 formed on a surface of the passivating contact layer 400 away from the first surface m1;

step 4, forming a second passivation layer 600 on a surface of the passivation medium layer 300 away from the first tunnel oxide layer 200;

step 5, forming a first electrode 500 on the first surface m1 of the substrate 100, where an orthographic projection of the first electrode 500 on the first surface m1 is located in the electrode region z1 of the first surface m1, and the first electrode 500 is in Ohmic contact with the first passivating contact layer 400;

step 6, sequentially forming a third tunnel oxide layer 710, a second doped semiconductor layer 720, and a third passivation layer 900 on the second surface m2 of the substrate 100;

step 7, forming a second electrode 800 on the second surface m2 of the substrate 100, where the second electrode 800 is in Ohmic contact with the second doped semiconductor layer 720.

Referring to FIGS. 9 to 11, in another specific embodiment, a method for preparing a solar cell includes following steps:

step 1, cleaning and texturing a silicon wafer, and polishing one surface of the silicon wafer, where the polished surface forms the first surface m1 of the substrate 100, and the textured surface forms the second surface m2 of the substrate 100;

step 2, forming a first tunnel oxide layer 200 on the first surface m1 of the substrate 100;

step 3, forming a first passivating contact layer 400 on the electrode region z1 of the first surface m1 of the substrate 100;

step 4, forming a passivation medium layer 300 on the first surface m1 of the substrate 100, where the passivation medium layer 300 includes a portion in contact with the first tunnel oxide layer 200 and another portion formed on a surface of the passivating contact layer 400 away from the first surface m1;

step 5, forming a second passivation layer 600 on a surface of the passivation medium layer 300 away from the first tunnel oxide layer 200;

step 6, forming a first electrode 500 on the first surface m1 of the substrate 100, where an orthographic projection of the first electrode 500 on the first surface m1 is located in the electrode region z1 of the first surface m1, and the first electrode 500 is in Ohmic contact with the first passivating contact layer 400;

step 7, sequentially forming a third tunnel oxide layer 710, a second doped semiconductor layer 720, and a third passivation layer 900 on the second surface m2 of the substrate 100;

step 8, forming a second electrode 800 on the second surface m2 of the substrate 100, where the second electrode 800 is in Ohmic contact with the second doped semiconductor layer 720.

It should be understood that, unless otherwise specified herein, the steps or stages described above are not necessarily be completed simultaneously but can be performed at different times. The steps or stages are not strictly performed in sequence, but can be performed alternately or in turn with at least some of the other steps or sub-steps or stages in the other steps, which can be selected according to actual needs and are not limited herein.

The solar cells in the embodiments of the present application are exemplarily described below on the basis of some examples and comparative examples.

In Example 1, the structure of the solar cell as shown in FIGS. 3 and 4 is employed. The substrate 110 of the solar cell is an n-type silicon wafer with a thickness of 120 μm. The first surface m1 of the substrate 110 serves as the light-receiving surface, while the second surface m2 serves as the back surface. The first tunnel oxide layer 200, the second tunnel oxide layer 410, and the third tunnel oxide layer 710 are all made of silicon dioxide, each with a thickness of 1.4 nm. The transparent conductive oxide layer 310 is made of aluminum-doped zinc oxide with a thickness of 10 cm, and the mass percentage of aluminum in the aluminum-doped zinc oxide is 12%. The first doped semiconductor layer 420 is an n-type doped polysilicon layer with a thickness of 150 nm. The second doped semiconductor layer 720 is a p-type doped polysilicon layer with a thickness of 200 nm. The first passivation layer 320 is made of aluminum oxide, with a thickness ranging from 3 nm to 100 nm. The second passivation layer 600 and the third passivation layer 900 are both made of silicon nitride. The thickness of the second passivation layer 600 is 70 nm, and the thickness of the third passivation layer 900 is 80 nm. The first electrode 500 and the second electrode 800 are both made of silver. The first electrode 500 located on the first surface m1 includes 18 busbar electrode lines and 200 finger electrode lines, where the width of each busbar electrode line is 200 μm, and the width of each finger electrode line is 20 μm. The size of the electrode region z1 of the first surface m1 along the second direction F2 is 100 μm. The second electrode 800 located on the second surface m2 includes 18 busbar electrode lines and 200 finger electrode lines, where the width of each busbar electrode line is 200 μm, and the width of each finger electrode line is 20 μm.

Example 2 is different from Example 1 in that in Example 2 the transparent conductive oxide layer 310 is made of aluminum-doped zinc oxide and has a thickness of 5 nm, and the mass percentage of aluminum in the aluminum-doped zinc oxide is 1%.

Example 3 is different from Example 1 in that in Example 3 the transparent conductive oxide layer 310 is made of aluminum-doped zinc oxide and has a thickness of 5 nm, and the mass percentage of aluminum in the aluminum-doped zinc oxide is 20%.

Example 4 is different from Example 1 in that in Example 4 the transparent conductive oxide layer 310 is made of aluminum-doped zinc oxide and has a thickness of 20 nm, and the mass percentage of aluminum in the aluminum-doped zinc oxide is 1%.

Example 5 is different from Example 1 in that in Example 5 the transparent conductive oxide layer 310 is made of aluminum-doped zinc oxide and has a thickness of 20 nm, and the mass percentage of aluminum in the aluminum-doped zinc oxide is 20%.

Example 6 is different from Example 1 in that in Example 6 the transparent conductive oxide layer 310 is made of aluminum-doped zinc oxide and has a thickness of 5 nm, and the mass percentage of aluminum in the aluminum-doped zinc oxide is 15%.

Example 7 is different from Example 1 in that in Example 7 the transparent conductive oxide layer 310 is made of gallium-doped zinc oxide and has a thickness of 10 nm, and the mass percentage of gallium in the gallium-doped zinc oxide is 12%.

Example 8 is different from Example 1 in that in Example 8 the transparent conductive oxide layer 310 is made of gallium-doped zinc oxide and has a thickness of 5 nm, and the mass percentage of gallium in the gallium-doped zinc oxide is 1%.

Example 9 is different from Example 1 in that in Example 9 the transparent conductive oxide layer 310 is made of boron-doped zinc oxide and has a thickness of 5 nm, and the mass percentage of boron in the boron-doped zinc oxide is 20%.

Example 10 is different from Example 1 in that in Example 10 the transparent conductive oxide layer 310 is made of boron-doped zinc oxide and has a thickness of 20 nm, and the mass percentage of boron in the boron-doped zinc oxide is 15%.

Example 11 is different from Example 1 in that the structure of the solar cell as shown in FIGS. 1 and 2 is employed, and the solar cell in Example 11 does not include the first passivation layer 320.

Example 12 is different from Example 2 in that the structure of the solar cell as shown in FIGS. 1 and 2 is employed, and the solar cell in Example 12 does not include the first passivation layer 320.

Example 13 is different from Example 3 in that the structure of the solar cell as shown in FIGS. 1 and 2 is employed, and the solar cell in Example 13 does not include the first passivation layer 320.

Example 14 is different from Example 4 in that the structure of the solar cell as shown in FIGS. 1 and 2 is employed, and the solar cell in Example 14 does not include the first passivation layer 320.

Example 15 is different from Example 5 in that the structure of the solar cell as shown in FIGS. 1 and 2 is employed, and the solar cell in Example 15 does not include the first passivation layer 320.

Example 16 is different from Example 6 in that the structure of the solar cell as shown in FIGS. 1 and 2 is employed, and the solar cell in Example 16 does not include the first passivation layer 320.

Example 17 is different from Example 7 in that the structure of the solar cell as shown in FIGS. 1 and 2 is employed, and the solar cell in Example 17 does not include the first passivation layer 320.

Example 18 is different from Example 8 in that the structure of the solar cell as shown in FIGS. 1 and 2 is employed, and the solar cell in Example 18 does not include the first passivation layer 320.

Example 19 is different from Example 9 in that the structure of the solar cell as shown in FIGS. 1 and 2 is employed, and the solar cell in Example 19 does not include the first passivation layer 320.

Example 20 is different from Example 10 in that the structure of the solar cell as shown in FIGS. 1 and 2 is employed, and the solar cell in Example 20 does not include the first passivation layer 320.

Example 21 is different from Example 1 in that the transparent conductive oxide layer 310 is made of aluminum-doped zinc oxide and has a thickness of 4 nm, and the mass percentage of aluminum in the aluminum-doped zinc oxide is 0.5%.

Example 22 is different from Example 21 in that the structure of the solar cell as shown in FIGS. 1 and 2 is employed, and the solar cell in Example 22 does not include the first passivation layer 320.

Example 23 is different from Example 1 in that the transparent conductive oxide layer 310 is made of aluminum-doped zinc oxide and has a thickness of 22 nm, and the mass percentage of aluminum in the aluminum-doped zinc oxide is 22%.

Example 24 is different from Example 23 in that the structure of the solar cell as shown in FIGS. 1 and 2 is employed, and the solar cell in Example 24 does not include the first passivation layer 320.

Example 25 is different from Example 1 in that the transparent conductive oxide layer 310 is made of aluminum-doped zinc oxide and has a thickness of 4 nm, and the mass percentage of aluminum in the aluminum-doped zinc oxide is 30%.

Example 26 is different from Example 25 in that the structure of the solar cell as shown in FIGS. 1 and 2 is employed, and the solar cell in Example 26 does not include the first passivation layer 320.

Example 27 is different from Example 1 in that the transparent conductive oxide layer 310 is made of aluminum-doped zinc oxide and has a thickness of 22 nm, and the mass percentage of aluminum in the aluminum-doped zinc oxide is 0.2%.

Example 28 is different from Example 27 in that the structure of the solar cell as shown in FIGS. 1 and 2 is employed, and the solar cell in Example 28 does not include the first passivation layer 320.

Example 29 is different from Example 1 in that the transparent conductive oxide layer 310 is made of gallium-doped zinc oxide and has a thickness of 22 nm, and the mass percentage of gallium in the gallium-doped zinc oxide is 0.2%.

Example 30 is different from Example 29 in that the structure of the solar cell as shown in FIGS. 1 and 2 is employed, and the solar cell in Example 30 does not include the first passivation layer 320.

Example 31 is different from Example 1 in that the transparent conductive oxide layer 310 is made of boron-doped zinc oxide and has a thickness of 30 nm, and the mass percentage of boron in the boron-doped zinc oxide is 30%.

Example 32 is different from Example 31 in that the structure of the solar cell as shown in FIGS. 1 and 2 is employed, the solar cell in Example 32 does not include the first passivation layer 320.

Figure 19:
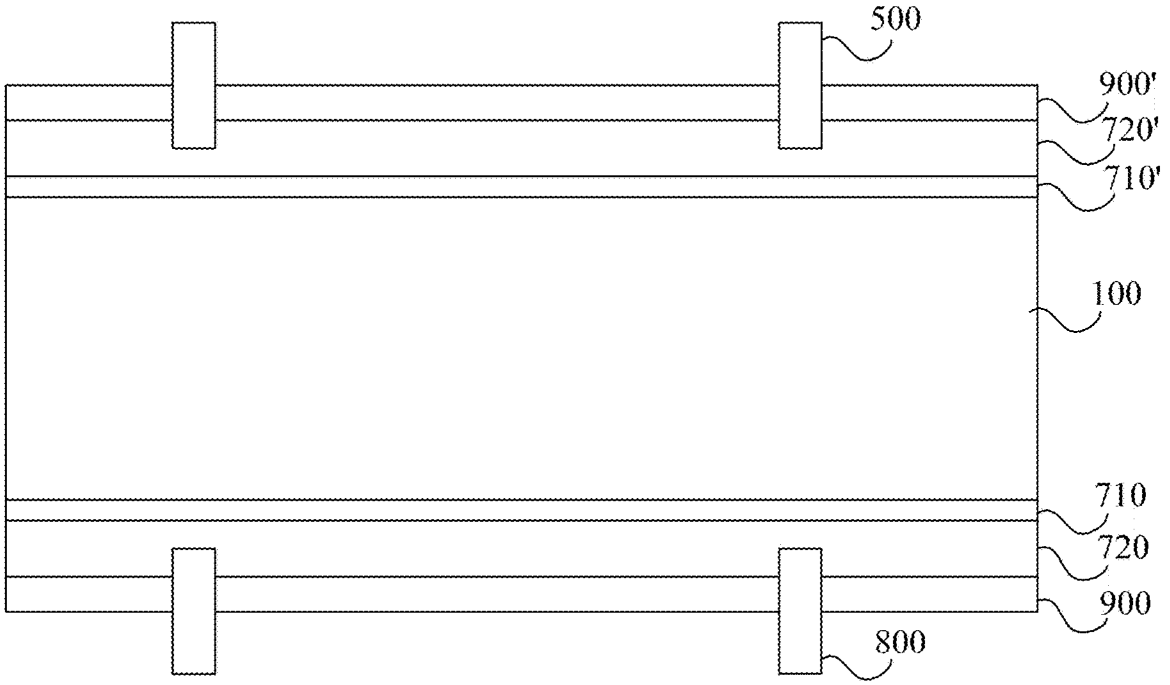
FIG. 19 is a schematic structural view of a solar cell in a comparative example of the present application.

Referring to FIG. 19, in Comparative Example 1, the structure on the second surface m2 of the substrate 100 is the same as that in Example 1. However, different from Example 1, the structure on the first surface m1 of the substrate 100 is the same as that on the second surface m2 of the substrate 100. That is, the structure on the first surface m1 of the substrate 100 sequentially includes a tunnel oxide layer 710', a doped polysilicon layer 720', a passivation layer 900', and an electrode 500. The structure on the first surface m1 of the substrate 100 is completely identical to the structure on the second surface m2 of the substrate 100 in all features such as location, shape, size, and material.

Figure 20:
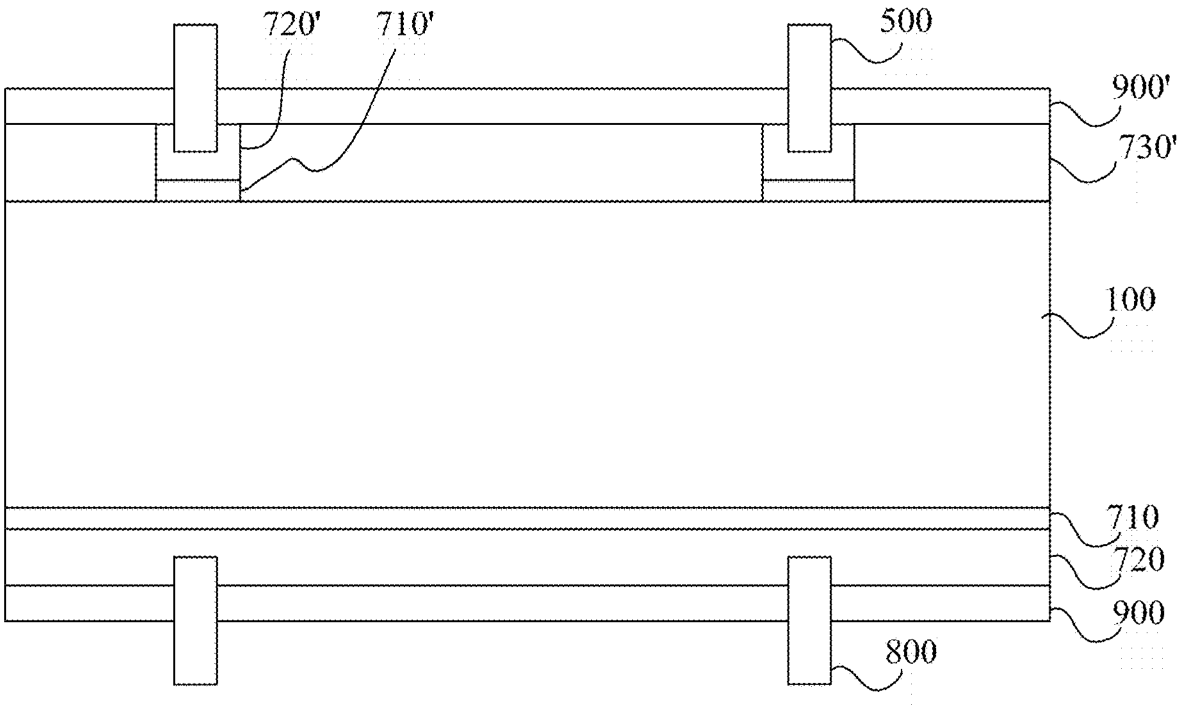
FIG. 20 is a schematic structural view of a solar cell in another comparative example of the present application.

Referring to FIG. 20, Comparative Example 2 is different from Comparative Example 1 only in the non-electrode region z2 of the first surface m1 of the substrate 100. Specifically, in the electrode region z1 on the first surface m1 of the substrate 100, there are sequentially the tunnel oxide layer 710', the doped polysilicon layer 720', the passivation layer 900', and the electrode 500, with materials and thicknesses consistent with those in Comparative Example 1. However, the portions of the tunnel oxide layer 710' and the doped polysilicon layer 720' in the non-electrode region z2 on the first surface m1 of the substrate 100 are replaced with a phosphorus-doped layer 730'.

The solar cells from Examples 1 to 32 and Comparative Examples 1 to 2 are subjected to electrical performance tests using a transient simulator device under the conditions of a light source of simulated sunlight of 100 mW/cm$^2$, AM1.5G, and a temperature of 25 degrees Celsius. The test results are shown in Table 1.

TABLE 1

| | Parameter | | | | |
|---|---|---|---|---|---|
| Group | Open-circuit voltage $V_{oc}$(V) | Short-circuit current density $I_{sc}$(mA/cm$^2$) | Serial resistance $R_s$(mohm) | Conversion efficiency Eff(%) | Fill factor FF(%) |
| Example 1 | 0.738 | 42.10 | 0.2 | 26.13 | 84.1 |
| Example 2 | 0.737 | 42.02 | 0.21 | 26.01 | 84 |
| Example 3 | 0.738 | 42.05 | 0.22 | 26.13 | 84.2 |
| Example 4 | 0.738 | 42.03 | 0.21 | 26.06 | 84 |
| Example 5 | 0.739 | 42.07 | 0.22 | 26.18 | 84.2 |
| Example 6 | 0.737 | 42.08 | 0.21 | 26.10 | 84.15 |
| Example 7 | 0.736 | 42.05 | 0.21 | 26.00 | 84 |
| Example 8 | 0.735 | 42.03 | 0.22 | 25.98 | 84.1 |
| Example 9 | 0.736 | 42.02 | 0.22 | 26.01 | 84.1 |
| Example 10 | 0.737 | 42.01 | 0.21 | 26.01 | 84 |
| Example 11 | 0.737 | 42.20 | 0.17 | 26.19 | 84.2 |
| Example 12 | 0.736 | 42.12 | 0.18 | 26.07 | 84.1 |
| Example 13 | 0.737 | 42.15 | 0.19 | 26.19 | 84.3 |
| Example 14 | 0.737 | 42.13 | 0.18 | 26.11 | 84.1 |
| Example 15 | 0.738 | 42.17 | 0.19 | 26.24 | 84.3 |
| Example 16 | 0.736 | 42.18 | 0.18 | 26.15 | 84.25 |
| Example 17 | 0.735 | 42.15 | 0.18 | 26.05 | 84.1 |
| Example 18 | 0.734 | 42.13 | 0.19 | 25.98 | 84 |
| Example 19 | 0.735 | 42.12 | 0.19 | 26.04 | 84.1 |
| Example 20 | 0.736 | 42.11 | 0.18 | 26.03 | 84 |
| Example 21 | 0.736 | 42.10 | 0.2 | 26.03 | 84 |
| Example 22 | 0.735 | 42.20 | 0.17 | 26.09 | 84.1 |
| Example 23 | 0.732 | 42.00 | 0.17 | 25.89 | 84.2 |
| Example 24 | 0.731 | 42.10 | 0.14 | 25.94 | 84.3 |
| Example 25 | 0.733 | 42.10 | 0.17 | 25.95 | 84.1 |
| Example 26 | 0.732 | 42.20 | 0.14 | 26.01 | 84.2 |
| Example 27 | 0.732 | 42.00 | 0.19 | 25.82 | 84 |
| Example 28 | 0.731 | 42.10 | 0.16 | 25.88 | 84.1 |
| Example 29 | 0.733 | 42.00 | 0.18 | 25.89 | 84.1 |
| Example 30 | 0.732 | 42.10 | 0.15 | 25.95 | 84.2 |
| Example 31 | 0.731 | 42.00 | 0.18 | 25.79 | 84 |
| Example 32 | 0.73 | 42.10 | 0.15 | 25.85 | 84.1 |
| Comparative Example 1 | 0.735 | 38.50 | 0.17 | 23.52 | 83.1 |
| Comparative Example 2 | 0.732 | 42.10 | 0.15 | 25.73 | 83.5 |

It can be seen from Table 1 that compared with Comparative Examples 1 and 2, the solar cells in Examples 1 to 32 exhibit higher conversion efficiencies and greater fill factors. Specifically, compared with Comparative Example 1, Examples 1 to 32 exhibit greater open-circuit voltages and short-circuit currents. Compared with Comparative Example 2, Examples 1 to 32 exhibit greater open-circuit voltages and fill factors. In Examples 5 and 15, the transparent conductive oxide layer is made of aluminum-doped zinc oxide, and has higher photovoltaic conversion efficiency than the transparent conductive oxide layers made of other metal oxides. Of course, the photovoltaic conversion efficiency of other examples is also improved compared with Comparative Example 1 and Comparative Example 2.

Based on the same inventive concept, an embodiment of the present application provides a photovoltaic module, including one or more solar cells described in any one of the above embodiments, or including one or more solar cells prepared by the method described in any one of the above embodiments.

In some embodiments, the photovoltaic module includes multiple solar cells. The solar cells can be electrically connected to form a whole piece or multiple pieces, such as forming a plurality of cell groups. The plurality of cell groups are electrically connected in series and/or in parallel. The photovoltaic device can further include an encapsulation layer and a cover plate. The encapsulation layer is configured to cover the surface of the cell groups, and the cover plate is configured to cover the surface of the encapsulation layer away from the cell groups. Specifically, in some embodiments, multiple cell groups can be electrically connected through conductive busbars. The encapsulation layer covers the surface of the solar cell. Exemplarily, the encapsulation layer can be an organic encapsulation film such as an ethylene-vinyl acetate copolymer film, a polyethylene-octene elastomer film, or a polyethylene terephthalate film. The cover plate can be a cover plate with a light-transmitting function, such as a glass cover plate or a plastic cover plate.

The effects of the solar cell in any one of the embodiments described above, or the effects of the solar cell prepared by the method in any one of the embodiments described above are also possessed by the photovoltaic module, and are not repeated herein.

Based on the same inventive concept, an embodiment of the present application provides a photovoltaic system, including one or more photovoltaic modules described in any one of the above embodiments. The effects of the photovoltaic module in any one of the embodiments described above are also possessed by the photovoltaic system, and are not repeated herein.

The photovoltaic system can be applied to photovoltaic power stations, such as ground power stations, roof power stations, water surface power stations, etc., and can also be applied to equipment or devices that use solar energy to generate electricity, such as user solar power supplies, solar street lights, solar cars, solar buildings, etc. It also can be understood that the application scenarios of the photovoltaic system are not limited to the above, that is to say, the photovoltaic system can be applied in all fields in which solar energy is needed to generate electricity. Taking a photovoltaic power generation network as an example, the photovoltaic system can include photovoltaic arrays, a combiner box, and an inverter. The photovoltaic array can be an array of photovoltaic modules. For example, multiple photovoltaic modules can form multiple photovoltaic arrays. The photovoltaic arrays are connected to the combiner box. The combiner box can combine the currents generated by the photovoltaic arrays. The combined current flows through the inverter and is converted into the alternating current suitable for the power grid, and then conducted to the power grid to realize solar power supply.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A solar cell, comprising:

a substrate including a first surface and a second surface opposite to the first surface, the first surface including an electrode region and a non-electrode region;

a first tunnel oxide layer disposed on the first surface of the substrate and at least partially in contact with the first surface;

a passivation medium layer disposed on a surface of the first tunnel oxide layer away from the substrate, the passivation medium layer including at least a transparent conductive oxide layer;

a second passivating contact layer, wherein the second passivating contact layer is disposed on the second surface of the substrate;

a first passivating contact layer disposed on the first surface and located in the electrode region, the first passivating contact layer including a first doped semiconductor layer; and a first electrode, an orthographic projection of the first electrode on the first surface being located in the electrode region of the first surface;

wherein the second passivating contact layer includes a third tunnel oxide layer and a second doped semiconductor layer sequentially stacked on the second surface; the first electrode sequentially penetrates through the transparent conductive oxide layer and the first tunnel oxide layer to form an Ohmic contact with the first passivating contact layer.

2. The solar cell according to claim 1, wherein a material of the transparent conductive oxide layer includes a doped metal oxide;

the doped metal oxide includes zinc oxide doped with at least one of aluminum, boron, or gallium;

the doped metal oxide is selected from the group consisting of aluminum-doped zinc oxide, gallium-doped zinc oxide, boron-doped zinc oxide, and any combination thereof.

3. The solar cell according to claim 1, wherein a thickness of the transparent conductive oxide layer is in a range from 5 nm to 20 nm.

4. The solar cell according to claim 1, wherein the passivation medium layer includes a transparent conductive oxide layer and a first passivation layer; the first passivation layer is disposed on a surface of the transparent conductive oxide layer away from the first tunnel oxide layer.

5. The solar cell according to claim 1, wherein the passivation medium layer includes at least one transparent conductive oxide layer and at least one first passivation layer; or the passivation medium layer includes one transparent conductive oxide layer and one first passivation layer, the transparent conductive oxide layer and the first passivation layer are sequentially stacked along a direction away from the first tunnel oxide layer; or the passivation medium layer includes at least two transparent conductive oxide layers and at least two first passivation layers, the transparent conductive oxide layers and the first passivation layers are alternately stacked along a direction away from the first tunnel oxide layer.

6. The solar cell according to claim 1, wherein orthographic projections of the first tunnel oxide layer and the passivation medium layer on the first surface includes an overlapping region; the overlapping region is located in the electrode region and the non-electrode region of the first surface.

7. The solar cell according to claim 1, wherein the first tunnel oxide layer is in contact with the first surface in the non-electrode region;.

8. The solar cell according to claim 7, wherein the first tunnel oxide layer includes a first portion and a second portion; the first portion is in contact with the first surface in the non-electrode region; the second portion is spaced from the first surface in the electrode region, and the second portion is disposed on a surface of the first passivating contact layer away from the first surface.

9. The solar cell according to claim 7, wherein the first passivating contact layer further includes a second tunnel oxide layer, the second tunnel oxide layer and the first doped semiconductor layer are stacked sequentially on the first surface in the electrode region.

10. The solar cell according to claim 1, further comprising a second passivation layer, wherein the second passivation layer is disposed on a surface of the passivation medium layer away from the first tunnel oxide layer.

11. The solar cell according to claim 1, further comprising a second electrode, wherein the second electrode is disposed on the second surface of the substrate, and the second electrode is in Ohmic contact with the second passivating contact layer; and/or further comprising a third passivation layer, wherein the third passivation layer is disposed on a surface of the second passivating contact layer away from the substrate.

12. The solar cell according to claim 1, wherein the first surface is a light-receiving surface.

13. The solar cell according to claim 1, the first passivating contact layer is disposed on the first surface and located only in the electrode region, a doping type of the first doped semiconductor layer is opposite to a doping type of the substrate.

14. The solar cell according to claim 1, wherein at least in the non-electrode region, the transparent conductive oxide layer is in contact with the first tunnel oxide layer.

15. The solar cell according to claim 1, wherein in both the electrode region and the non-electrode region, the transparent conductive oxide layer is in contact with the first tunnel oxide layer.

16. A solar cell, comprising:

a substrate comprising a first surface and a second surface opposite to the first surface, the first surface including an electrode region and a non-electrode region;

a first tunnel oxide layer disposed on the first surface of the substrate and at least partially in contact with the first surface; and a passivation medium layer disposed on a surface of the first tunnel oxide layer away from the substrate, the passivation medium layer including at least a transparent conductive oxide layer; and wherein a distance from the first surface to a surface of the transparent conductive oxide layer away from the substrate in the electrode region is greater than that in the non-electrode region.

17. A solar cell, comprising:

a substrate comprising a first surface and a second surface opposite to the first surface, the first surface includes an electrode region and a non-electrode region;

a first tunnel oxide layer disposed on the first surface of the substrate and at least partially in contact with the first surface;

a passivation medium layer disposed on a surface of the first tunnel oxide layer away from the substrate, the passivation medium layer including at least a transparent conductive oxide layer;

a first passivating contact layer disposed on the first surface and located only in the electrode region; and a first electrode, wherein an orthographic projection of the first electrode on the first surface is located in the electrode region of the first surface, and the first electrode is in Ohmic contact with the first passivating contact layer;

wherein the passivation medium layer includes at least two transparent conductive oxide layers and at least two first passivation layers, the transparent conductive oxide layers and the first passivation layers are alternately stacked along a direction away from the first tunnel oxide layer.

* * * * *